(12) United States Patent
Wu et al.

(10) Patent No.: US 10,942,221 B2
(45) Date of Patent: Mar. 9, 2021

(54) METHOD AND APPARATUS CAPABLE OF ACCURATELY ESTIMATING/DETERMINING POWER PERCENTAGE OF BATTERY BASED ON CONFIDENCE LEVELS DETERMINED FROM RESULTANT INFORMATION OF MULTIPLE DIFFERENT FUEL GAUGE OPERATIONS AND/OR INFORMATION OF BATTERY HISTORY, AGING FACTOR, SLEEP TIME, OR BATTERY TEMPERATURE

(71) Applicant: MEDIATEK INC., Hsin-Chu (TW)

(72) Inventors: Jui-Chi Wu, Taichung (TW); Jia-You Chuang, Hsinchu County (TW); Tsung-Ju Tsai, Yunlin County (TW)

(73) Assignee: MEDIATEK INC., Hsin-Chu (TW)

( * ) Notice: Subject to any disclaimer, the term of this patent is extended or adjusted under 35 U.S.C. 154(b) by 672 days.

(21) Appl. No.: 15/713,696

(22) Filed: Sep. 24, 2017

(65) Prior Publication Data

US 2018/0011145 A1    Jan. 11, 2018

Related U.S. Application Data

(63) Continuation-in-part of application No. 15/287,720, filed on Oct. 6, 2016, now abandoned.
(Continued)

(51) Int. Cl.
*A61N 1/00* (2006.01)
*G01R 31/387* (2019.01)
(Continued)

(52) U.S. Cl.
CPC ......... *G01R 31/387* (2019.01); *G01R 31/367* (2019.01); *G01R 31/371* (2019.01);
(Continued)

(58) Field of Classification Search
CPC .......................... G01R 31/389; G01R 31/3842
See application file for complete search history.

(56) References Cited

U.S. PATENT DOCUMENTS 6,208,148 B1    3/2001    Yuen
6,630,814 B2    10/2003   Ptasinski
(Continued)

FOREIGN PATENT DOCUMENTS

CN    101971043 A    2/2011
CN    101990641 A    3/2011
(Continued)

OTHER PUBLICATIONS

Wu et al., Title of Invention: Schemes Capable of Efficiently and Accurately Estimating and/or Predicting Available Battery Capacity and Battery Aging Factor, U.S. Appl. No. 15/285,497, filed Oct. 5, 2016.
(Continued)

*Primary Examiner* — Lam S Nguyen
(74) *Attorney, Agent, or Firm* — Winston Hsu

(57) ABSTRACT

A method for estimating a battery power percentage of a battery includes: performing a first fuel gauge operation upon the battery; and using the first fuel gauge operation to generate the battery power percentage of the battery by referring to information measured by a second fuel gauge operation performed upon the battery wherein the second fuel gauge operation is different from the first fuel gauge operation.

18 Claims, 14 Drawing Sheets

Related U.S. Application Data

(60) Provisional application No. 62/291,474, filed on Feb. 4, 2016.

(51) Int. Cl.

| | | |
|---|---|---|
| *H01M 10/48* | (2006.01) | |
| *G01R 31/374* | (2019.01) | |
| *G01R 31/389* | (2019.01) | |
| *G01R 31/3842* | (2019.01) | |
| *H02J 7/00* | (2006.01) | |
| *G01R 31/367* | (2019.01) | |
| *G01R 31/392* | (2019.01) | |
| *G01R 31/371* | (2019.01) | |

(52) U.S. Cl.
CPC ......... *G01R 31/374* (2019.01); *G01R 31/389* (2019.01); *G01R 31/3842* (2019.01); *G01R 31/392* (2019.01); *H01M 10/48* (2013.01); *H01M 10/482* (2013.01); *H02J 7/0047* (2013.01); *H02J 7/0048* (2020.01)

(56) References Cited

U.S. PATENT DOCUMENTS

| | | |
|---|---|---|
| 2001/0022518 A1 | 9/2001 | Asakura |
| 2005/0017685 A1 | 1/2005 | Rees |
| 2005/0102005 A1 | 5/2005 | Krig |
| 2008/0097544 A1 | 4/2008 | Gandhi |
| 2012/0226402 A1 | 9/2012 | Minamiura |
| 2013/0073236 A1 | 3/2013 | Wu |
| 2013/0090900 A1 | 4/2013 | Gering |

FOREIGN PATENT DOCUMENTS

| | | |
|---|---|---|
| CN | 102262216 A | 11/2011 |
| CN | 103529389 A | 1/2014 |
| CN | 104459544 A | 3/2015 |
| CN | 204330996 U | 5/2015 |
| CN | 105259508 A | 1/2016 |
| CN | 105277894 A | 1/2016 |
| CN | 105372602 A | 3/2016 |
| CN | 105403837 A | 3/2016 |
| JP | 2008-151745 A | 7/2008 |
| TW | 200816543 | 4/2008 |
| TW | 201403105 A | 1/2014 |

OTHER PUBLICATIONS

Wu et al., Title of Invention: Method and Apparatus Capable of Accurately Estimating/Determining Power Percentage of Battery Based on Confidence Levels Determined From Resultant Information of Multiple Different Fuel Gauge Operations and/or Information of Battery History, Aging Factor, Sleep Time, or Battery Temperature, U.S. Appl. No. 15/287,720, filed Oct. 6, 2016.

METHOD AND APPARATUS CAPABLE OF ACCURATELY ESTIMATING/DETERMINING POWER PERCENTAGE OF BATTERY BASED ON CONFIDENCE LEVELS DETERMINED FROM RESULTANT INFORMATION OF MULTIPLE DIFFERENT FUEL GAUGE OPERATIONS AND/OR INFORMATION OF BATTERY HISTORY, AGING FACTOR, SLEEP TIME, OR BATTERY TEMPERATURE

CROSS REFERENCE TO RELATED APPLICATION

This application is a continuation in part application and claims the benefit of U.S. Non-provisional Application Ser. No. 15/287,720, which was filed on Oct. 6, 2016 and is included herein by reference. In addition, U.S. Non-provisional Application Ser. No. 15/287,720 claims the benefit of U.S. provisional application Ser. No. 62/291,474 filed on Feb. 4, 2016, which is entirely incorporated herein by reference.

BACKGROUND

Generally speaking, nowadays multiple kinds of conventional fuel gauge schemes are provided to estimate a power percentage of a battery, especially when the battery is re-connected to a fuel gauge device or is connected to the fuel gauge device for the first time. Unfortunately, the conventional schemes have their performance limitations respectively since the battery may be replaced, charged, discharged, processed, or at a static condition; that is, the battery condition may be different at different timings. For example, some conventional schemes may be able to achieve high estimation accuracy but is applied and workable only when the battery has been at a static condition for a long time period. Other conventional schemes may be applied and workable for all battery conditions but cannot achieve high estimation accuracy. Thus, it is extremely hard to merely employ a single kind of conventional fuel gauge scheme to achieve both high estimation accuracy and high applicability for all battery conditions.

SUMMARY

Therefore one of the objectives of the invention is to provide methods and apparatuses capable of more accurately estimating a power percentage of a battery, to solve the above-mentioned problems.

According to embodiments of the invention, a method capable of accurately estimating a power percentage of a battery is disclosed. The method comprises: performing a first fuel gauge operation to measure a power percentage of the battery to generate a first information comprising at least one of a first percentage and a first battery cell voltage corresponding to the first percentage; performing a second fuel gauge operation to measure the power percentage of the battery to generate a second information comprising at least one of a second percentage and a second battery cell voltage corresponding to the second percentage, the first fuel gauge operation being different from the second fuel gauge operation; and, dynamically determining one among the first percentage and the second percentage as the power percentage of the battery according to the first information and the second information.

According to the embodiments, a method capable of accurately estimating a power percentage of a battery is further disclosed. The method comprises: reading or loading a previous information of the battery from a memory device wherein the previous information comprises at least one of a previous power percentage of the battery and a previous battery cell voltage corresponding to the previous power percentage; performing a first fuel gauge operation to measure the power percentage of the battery to generate a first information, which comprises at least one of the first percentage and a first battery cell voltage corresponding to the first percentage; performing a second fuel gauge operation to measure the power percentage of the battery to generate a second information, which comprises at least one of the second percentage and a second battery cell voltage corresponding to the second percentage, the first fuel gauge operation being different from the second fuel gauge operation; and, dynamically determining one among the previous power percentage, the first percentage, and the second percentage as the power percentage of the battery according to the first information and the second information.

According to the embodiments, a power management apparatus capable of accurately estimating a power percentage of a battery is further disclosed. The apparatus comprises a memory device and a controller. The controller is coupled to the memory device, configured for loading program code(s) from the memory device to: perform a first fuel gauge operation to measure a power percentage of the battery to generate a first information comprising at least one of a first percentage and a first battery cell voltage corresponding to the first percentage; perform a second fuel gauge operation to measure the power percentage of the battery to generate a second information comprising at least one of a second percentage and a second battery cell voltage corresponding to the second percentage, the first fuel gauge operation being different from the second fuel gauge operation; and, dynamically determine one among the first percentage and the second percentage as the power percentage of the battery according to the first information and the second information.

According to the embodiments, a power management apparatus capable of accurately estimating a power percentage of a battery is further disclosed. The apparatus comprises a memory device and a controller. The controller is coupled to the memory device and configured for: reading or loading a previous information of the battery from a memory device wherein the previous information comprises at least one of a previous power percentage of the battery and a previous battery cell voltage corresponding to the previous power percentage; performing a first fuel gauge operation to measure the power percentage of the battery to generate a first information, which comprises at least one of the first percentage and a first battery cell voltage corresponding to the first percentage; performing a second fuel gauge operation to measure the power percentage of the battery to generate a second information, which comprises at least one of the second percentage and a second battery cell voltage corresponding to the second percentage, the first fuel gauge operation being different from the second fuel gauge operation; and, dynamically determining one among the previous power percentage, the first percentage, and the second percentage as the power percentage of the battery according to the first information and the second information.

According to embodiments of the invention, a method for estimating a battery power percentage of a battery is disclosed. The method comprises: performing a first fuel gauge operation upon the battery; and using the first fuel gauge operation to generate the battery power percentage of the battery by referring to information measured by a second fuel gauge operation performed upon the battery, the second fuel gauge operation being different from the first fuel gauge operation.

According to the embodiments, a power management apparatus for estimating a battery power percentage of a battery is disclosed. The power management apparatus comprises a memory device and a controller. The controller is coupled to the memory device and configured for loading program code(s) from the memory device to: perform a first fuel gauge operation upon the battery; and use the first fuel gauge operation to generate the battery power percentage of the battery by referring to information measured by a second fuel gauge operation performed upon the battery wherein the second fuel gauge operation is different from the first fuel gauge operation.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
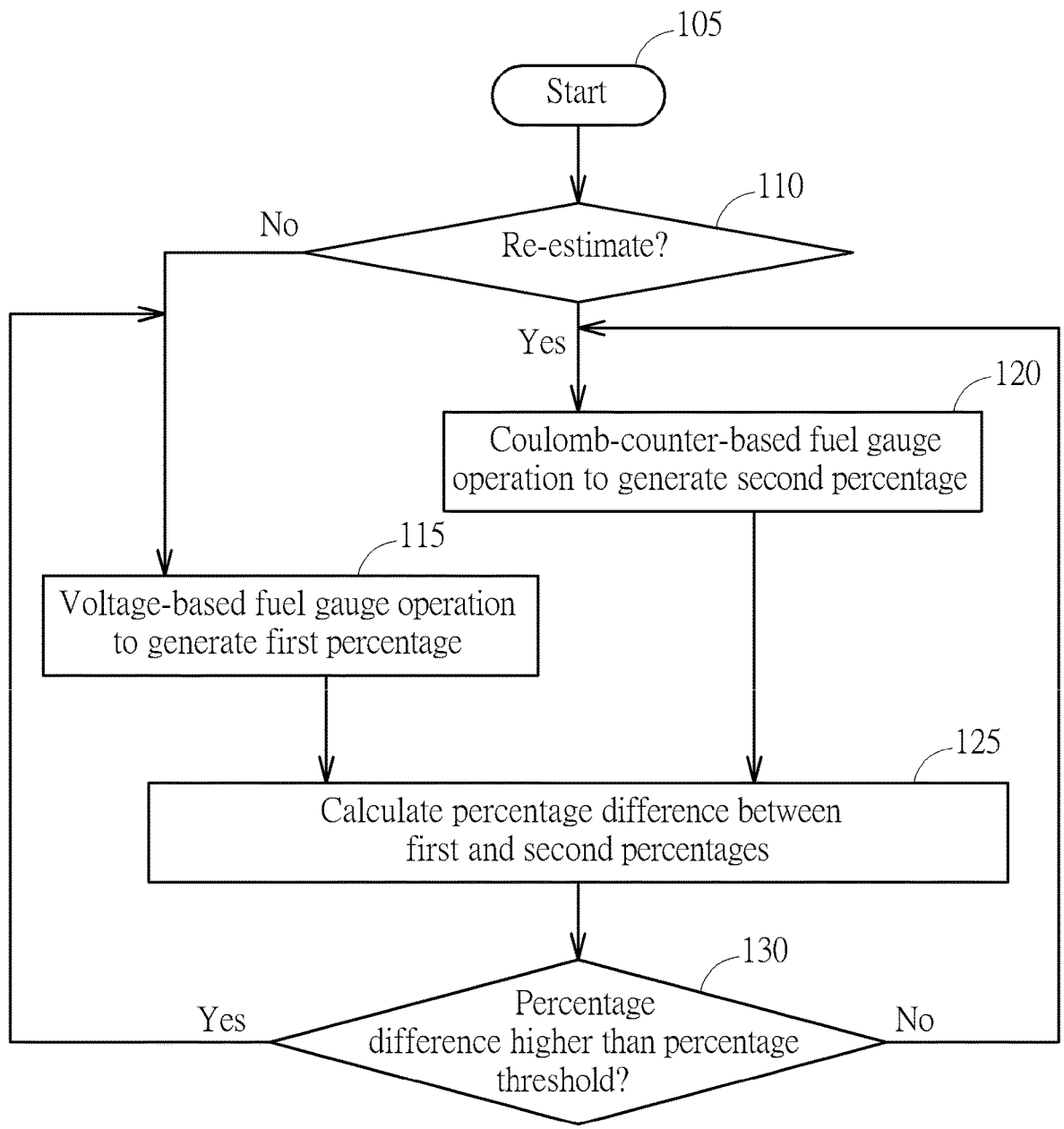
FIG. 1 is a diagram showing a flowchart of a method capable of accurately gauging/measuring power percentage of a battery according to a first embodiment of the invention.

Please refer to FIG. 1, which is a diagram showing a flowchart of a method capable of accurately gauging/measuring power (especially remaining power) of a battery according to a first embodiment of the invention. The method can improve the accuracy of a battery power percentage measurement for the battery significantly. It should be noted that the battery power percentage in embodiments of this application is represented by depth-of-discharge (DOD). This is not intended to be a limitation since the battery power percentage can be also represented by state-of-charge (SOC) which is the complement of DOD. The method is arranged to employ and perform two different fuel gauge operations to generate two different information results each comprising at least one of a percentage represented by DOD and a battery cell voltage corresponding to the percentage wherein the two different information results are regarded as measurement results, and dynamically select one from the measurement results of the two different fuel gauge operations as a measurement result based on different conditions of the battery. In practice, the method is arranged to dynamically grade/set different confidence levels for the two fuel gauge operations under different conditions. The confidence level of one fuel gauge operation is configured to be higher than that of the other fuel gauge operation in some situations, but in other situations it is configured to be lower. Thus, by dynamically grading/adjusting the confidence levels under different conditions, the method can configure/set the measurement result as one percentage of one fuel gauge operation having a higher confidence level. In addition, the method can be arranged to select the measurement result of one corresponding operation among/from at least three fuel gauge operations based on their confidence levels; the number of fuel gauge operations is not intended to be a limitation.

In the embodiments, the two different fuel gauge operations comprise a first fuel gauge operation such as a voltage-based fuel gauge operation and a second fuel gauge operation such as a Coulomb-counter-based fuel gauge operation. The voltage-based fuel gauge operation is to adopt a sensing resistor and measure a voltage drop across the sensing resistor to estimate the current of the battery so as to measure the remaining power of the battery and obtain a first information comprising at least one of a corresponding first percentage represented by DOD and a first battery cell voltage corresponding to the first percentage. The Coulomb-counter-based fuel gauge operation is to adopt a Coulomb counter circuit to measure the current of the battery so as to measure the remaining power of the battery and obtain a second information comprising at least one of a corresponding second percentage represented by DOD and a second battery cell voltage corresponding to the second percentage. The method can improve the traditional scheme and provide a more precise fuel gauge result for a user based on the benefits of adopting both the voltage-based fuel gauge operation and the Coulomb-counter-based fuel gauge operation even though the battery is operated under different conditions such temperatures, aging factors, battery history, and so on.

It should be noted that the operation of determining which percentage as the percentage of the battery is based on the first information and the second information. In practice, the determining operation can be performed based on the first percentage and the second percentage; alternatively, the determining operation can be performed based on the first battery cell voltage and the second battery cell voltage. The advantage of performing determining operation based on the first battery cell voltage and the second battery cell voltage is that in some situations the range of changes of corresponding battery cell voltages can be boarder than that of changes of the above-mentioned percentages. In addition, it is easy to obtain the corresponding battery cell voltages by converting the above-mentioned percentages to generate the corresponding battery cell voltages based on a look-up table.

Provided that substantially the same result is achieved, the steps of the flowchart shown in FIG. 1 need not be in the exact order shown and need not be contiguous, that is, other steps can be intermediate. Steps of FIG. 1 are detailed in the following:

Step 105: Start;

Step 110: Determine whether to re-estimate or re-calculate the power percentage of the battery? If so, the flow proceeds to Step 120, otherwise, the flow proceeds to Step 115;

Step 115: Perform the voltage-based fuel gauge operation by using the sensing resistor and measuring the voltage drop across the sensing resistor to estimate the current of the battery so as to measure the remaining power percentage of the battery and generate the first percentage;

Step 120: Perform the Coulomb-counter-based fuel gauge operation by using the Coulomb counter circuit to measure the current of the battery so as to measure the remaining power percentage of the battery and generate the second percentage;

Step 125: Compare and calculate a percentage difference between the first and second percentages; and Step 130: Determine whether the percentage difference is higher than a percentage threshold? If the percentage different is higher than the percentage threshold, the confidence level of voltage-based fuel gauge operation is configured to be higher than that of Coulomb-counter-based fuel gauge operation, and the flow proceeds to Step 120; otherwise, the confidence level of voltage-based fuel gauge operation is configured to be lower than that of Coulomb-counter-based fuel gauge operation, and the flow proceeds to Step 115.

In Step 110, the operation of how to determine whether to re-estimate or re-calculate the power percentage of the battery can be executed/performed by determining whether the battery has remained at a static condition for a specific time period wherein the static condition means that when the battery is at the static condition the battery provides no currents or few currents for a system. If the battery has remained at the static condition for the specific time period, the method is arranged to determine that the battery has been rested for the specific time period, and to enable re-estimation or re-calculation of the power percentage of the battery, to calculate the power percentage at present. Then, the flow proceeds to Step 120. In Step 120, the Coulomb counter circuit is adopted to measure/accumulate the current of the battery during a time interval so as to measure the power percentage of the battery.

It should be noted that the method in Step 105 is arranged to determine estimate or calculate an initial power percentage of the battery and thus the flow proceeds to Step 115 when the system powered by the battery is restarted. In Step 115, the voltage-based fuel gauge operation is performed by adopting an AC (alternating current) resistor and measuring a voltage drop across the AC resistor to estimate the current of the battery so as to measure the power percentage of the battery represented by DOD or by SOC at present. The change of voltage drop can reflect the current change of the battery, and thus the method can measure the DOD percentage of the battery at present according to the change of voltage drop.

In Step 125 and Step 130, the method is arranged to dynamically and selectively choose one among two measurement results of the Coulomb-counter-based fuel gauge operation and voltage-based fuel gauge operation. The method is arranged to compare and calculate the percentage difference between the two percentages and then decide if the percentage difference is higher than the percentage threshold. If the percentage difference is higher than the percentage threshold, the method determines that the reliability of Coulomb-counter-based fuel gauge operation is lower than that of voltage-based fuel gauge operation, and accordingly its confidence level is set as a lower level. Instead, if the percentage difference is lower than the percentage threshold, the method determines that the reliability of Coulomb-counter-based fuel gauge operation is higher than that of voltage-based fuel gauge operation, and accordingly its confidence level is set as a higher level. By doing so, the method can effectively evaluate the reliabilities of the Coulomb-counter-based fuel gauge operation and voltage-based fuel gauge operation, and thus determines one of the two measurement results as the resultant battery power percentage result. Since the two different fuel gauge operations have different benefits, precisions, and measurement conditions, by selectively adopting one measurement result as the resultant result, the method can obtain the benefits of both the two different fuel gauge operations and avoid their limitations. For example, if the battery has been remained at the static condition, the method can adopt the percentage of Coulomb-counter-based fuel gauge operation as the resultant battery power percentage result. If the battery does not remain at the static condition, the method can adopt the percentage of voltage-based fuel gauge operation as the resultant battery power percentage result. That is, the method is arranged to enable both the two different fuel gauge operations and dynamically select one measurement result of the different fuel gauge operations as a resultant measurement result. Therefore, the method can improve the accuracy of resultant measurement result and display the resultant measurement result of battery power percentage for users.

In another embodiment, for Step 125, the method can be arranged to compare and calculate a voltage difference between the first battery cell voltage and the second battery cell voltage. For Step 130, the method can be arranged to determine whether the voltage difference is higher than a voltage threshold or not. If the voltage difference is higher than the voltage threshold, the confidence level of voltage-based fuel gauge operation is configured to be higher than that of Coulomb-counter-based fuel gauge operation. Otherwise, the confidence level of voltage-based fuel gauge operation is configured to be lower than that of Coulomb-counter-based fuel gauge operation.

Further, if the confidence level of voltage-based fuel gauge operation is higher than the confidence level of Coulomb-counter-based fuel gauge operation and exceeds above a high threshold (or if the percentage difference between the two percentages become higher than a high percentage threshold), this implies that the measurement result of voltage-based fuel gauge operation becomes more reliable, and in this situation it is arranged to re-perform the Coulomb-counter-based fuel gauge operation to measure the power percentage of the battery to generate the percentage result of Coulomb-counter-based fuel gauge operation again, and to re-grade the confidence level for Coulomb-counter-based fuel gauge operation. This equivalently improves the accuracy of Coulomb-counter-based fuel gauge operation by referring to the measurement result of voltage-based fuel gauge operation. Similarly, if the confidence level of Coulomb-counter-based fuel gauge operation is higher than the confidence level of voltage-based fuel gauge operation and exceeds above the high threshold (or if the percentage difference between the two percentages become higher than the high percentage threshold), this implies that the measurement result of Coulomb-counter-based fuel gauge operation becomes more reliable, and in this situation it is arranged to re-perform the voltage-based fuel gauge operation to measure the power percentage of the battery to generate the percentage result of voltage-based fuel gauge operation again, and to re-grade the confidence level for voltage-based fuel gauge operation. This equivalently improves the accuracy of voltage-based fuel gauge operation by referring to the measurement result of Coulomb-counter-based fuel gauge operation.

Figure 2:
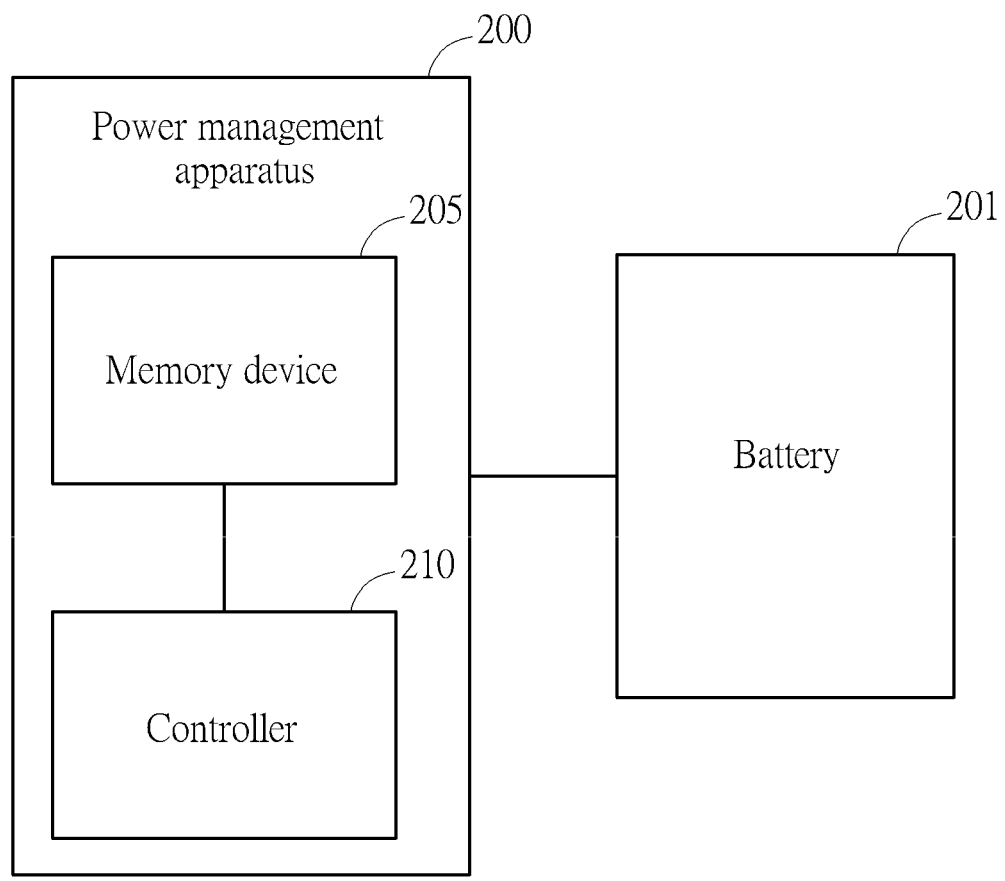
FIG. 2 is a block diagram of a power management apparatus capable of accurately gauging/measuring remaining power of the battery according to the flowchart of FIG. 1.

The above-mentioned procedure or at least one step can be performed through a controller or microcontroller by executing corresponding program code(s) loaded from a memory device such as a register circuit. FIG. 2 is a block diagram of a power management apparatus 200 capable of accurately gauging/measuring remaining power of the battery 201 according to the flowchart of FIG. 1. The power management apparatus 200 is coupled to the battery 201 and comprises a memory device 205 and a controller 210, and can be implemented by using a single integrated circuit chip. The memory device 205 is arranged to store or buffer the measurement results (i.e. percentages) of the above-mentioned fuel gauge operations and corresponding program code(s). The controller 210 is coupled to the memory device 205 and arranged for loading the program code(s) from the memory device 205 to enable and perform the two fuel gauge operations to estimate the power percentage of the battery when a software application or a system is enabled or stated. The controller 210 then is arranged to execute the program code(s) to perform the operations of above-mentioned steps. Further description is not detailed for brevity.

Figure 3:
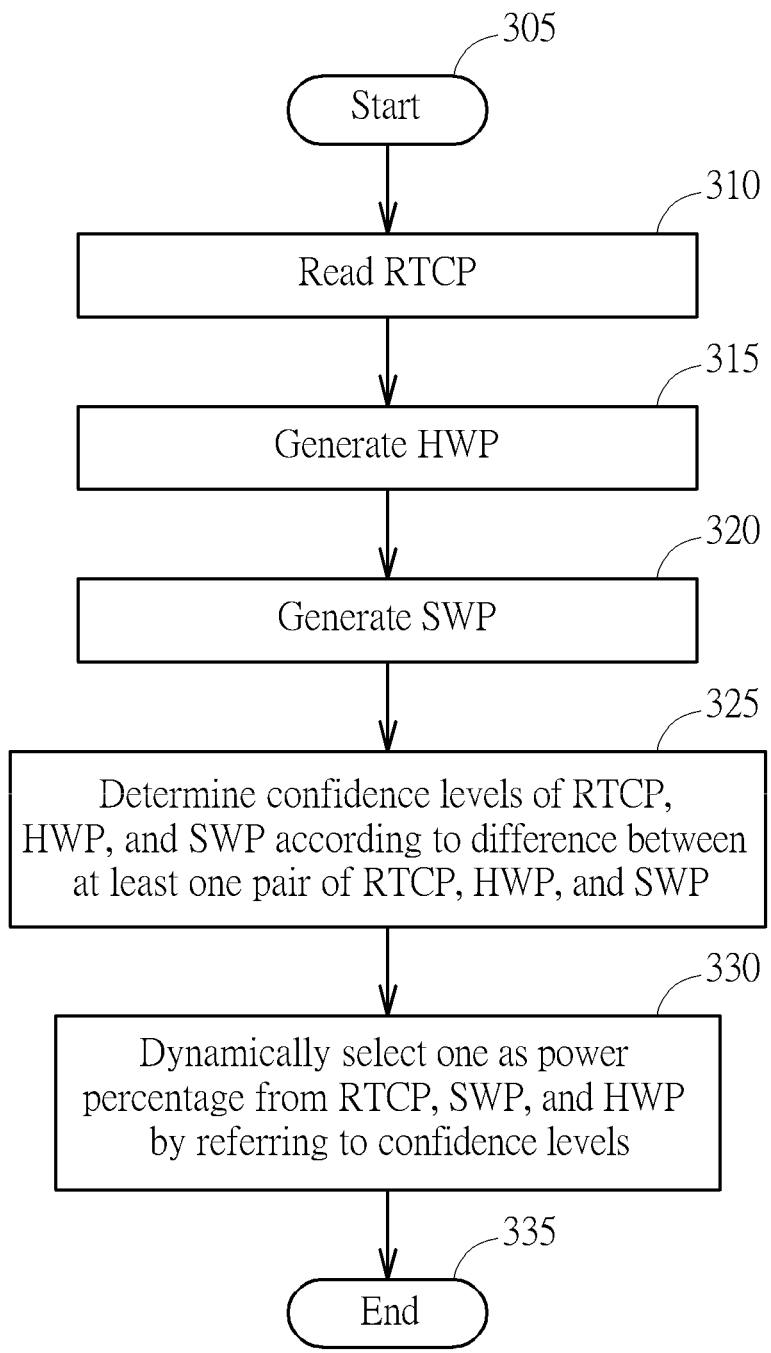
FIG. 3 is a diagram showing a flowchart of a method capable of accurately gauging/measuring power percentage of a battery according to a second embodiment of the invention.

Additionally, in a second embodiment of the invention, a method is provided and capable of more accurately estimate/calculate a power percentage of the battery. Particularly, the power percentage for example is a percent of depth-of-discharge (but not limited) of the battery when a system powered by the battery is restarted or the battery has been rested for a time period (a fully rested state or a static state). In some embodiments, the power percentage can be represented by state-of-charge. More specifically, the method can be arranged to estimate or measure an initial power percentage of the battery, and can improve the accuracy of the estimation for the initial power percentage, especially when the battery is connected or re-connected to a Coulomb counter circuit at the first time. The method is arranged to precisely select one power percentage from the set of a previous power percentage, a software estimation percentage, and a hardware measurement percentage as the initial power percentage of the battery according to confidence level(s) calculated or determined from information comprising at least one of the percentage difference between at least one pair of the above-mentioned percentages and the voltage difference between at least one pair of battery cell voltages corresponding to the above-mentioned percentages. That is, selecting one power percentage as the initial power percentage of the battery can be based on the percentage difference and/or a corresponding battery cell voltage difference. In addition, the method can optionally display the previous power percentage for a user to improve user experience in some situations even though the initial power percentage of the battery is determined as the hardware measurement percentage or software estimation percentage. Provided that substantially the same result is achieved, the steps of the flowchart shown in FIG. 3 need not be in the exact order shown and need not be contiguous, that is, other steps can be intermediate. Steps of FIG. 3 are detailed in the following:

Step 305: Start;

Step 310: Read the previous power percentage RTCP (or called a last power percentage) from a memory device such as a register circuit located inside or outside a battery pack comprising the battery;

Step 315: Generate a hardware measurement percentage HWP for the battery by using a hardware circuit such as a Coulomb counter circuit wherein the hardware measurement percentage HWP for example is a hardware open-circuit voltage measurement percentage;

Step 320: Generate a software estimation percentage SWP for the battery by using a software algorithm capable of estimating power of the battery wherein the software estimation percentage SWP for example is a software open-circuit voltage estimation percentage;

Step 325: Calculate or determine confidence levels of the previous power percentage RTCP, the hardware measurement percentage HWP, and the software estimation percentage SWP according to the difference between at least one pair of the above-mentioned percentages;

Step 330: Dynamically select one as the initial power percentage from the previous power percentage RTCP, the hardware measurement percentage HWP, and the software estimation percentage SWP, by referring to the above-mentioned confidence levels; and Step 335: End.

For example, if the difference (or absolute difference) between the hardware measurement percentage HWP and the previous power percentage RTCP is much higher than a threshold such as 30% DOD, the method is arranged to determine that the confidence level of the previous power percentage RTCP is lower than those of hardware measurement percentage HWP and software estimation percentage SWP. Additionally, if the difference (or absolute difference) between the software estimation percentage SWP and previous power percentage RTCP is higher than a threshold such as 10% DOD, the method is arranged to determine that the confidence level of software estimation percentage SWP is higher than that of previous power percentage RTCP. Additionally, if the difference (or absolute difference) between hardware measurement percentage HWP and software estimation percentage SWP is higher than a threshold such as 15%, the method is arranged to determine that the confidence level of software estimation percentage SWP is higher than that of hardware measurement percentage HWP. Additionally, the method can raise the confidence level of the previous power percentage RTCP if the battery is not connected to a charger device, not swapped/preplaced, and/or the previous power percentage RTCP is not accessed/processed. Additionally, the method can raise the confidence level of software estimation percentage SWP if the software estimation percentage SWP is lower than a low threshold such as 3% DOD. Thus, by referring to at least one step to grade, configure, or adjust the confidence levels of the previous power percentage RTCP, software estimation percentage SWP, and hardware measurement percentage HWP, the method can accordingly and accurately select one from the three percentages as the initial power percentage of the battery. Several modified embodiments are provided and detailed in the following.

Additionally, in Step 325, in another embodiment, the method can be arranged to calculate or determine the confidence levels of previous power percentage RTCP, hardware measurement percentage HWP, and software estimation percentage SWP according to a voltage difference of at least one pair between the battery cell voltages corresponding to the percentages RTCP, HWP, and SWP.

Figure 4A:
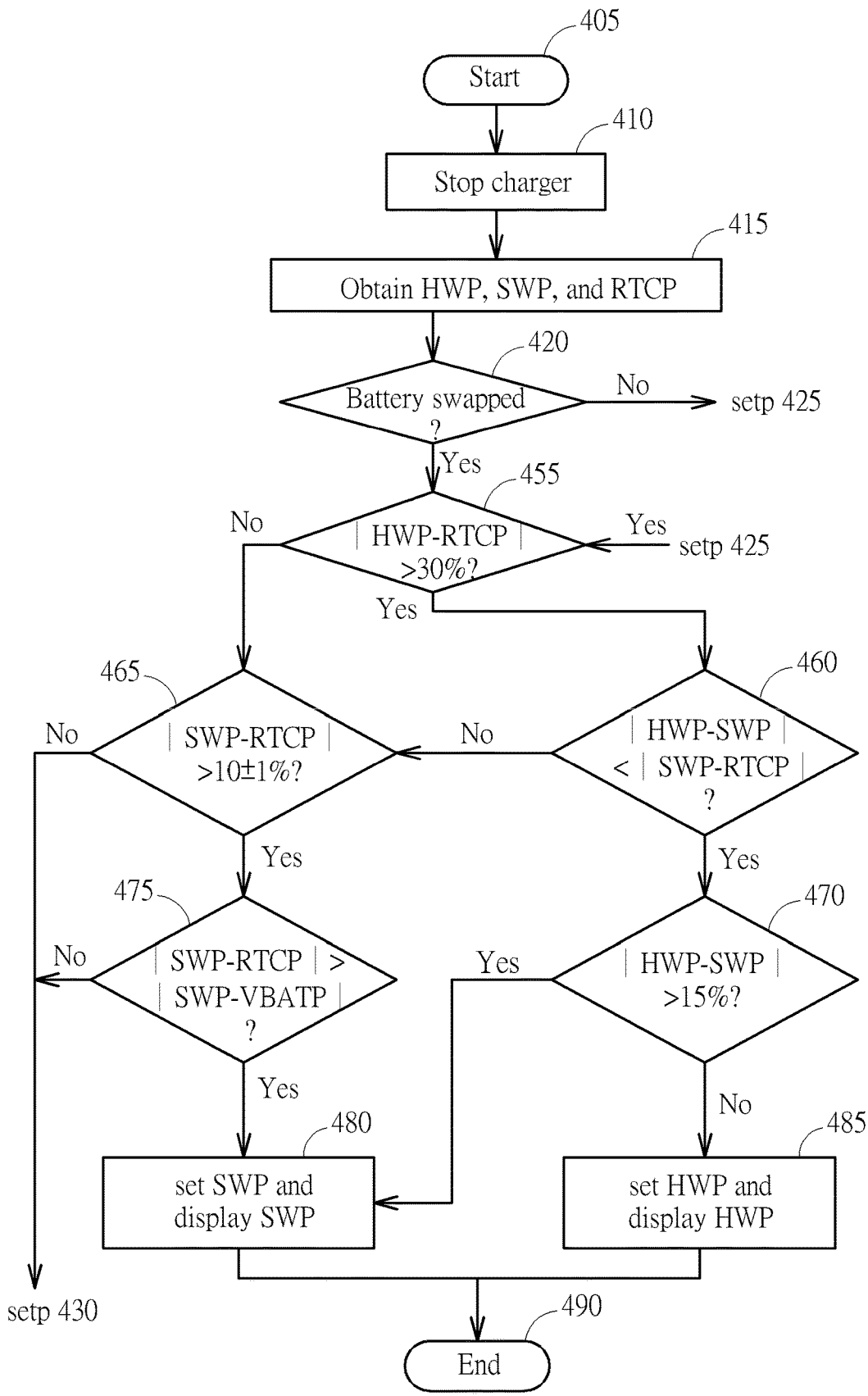
FIG. 4A, FIG. 4B, FIG. 5, FIG. 6A, and FIG. 6B are diagrams respectively illustrating flowcharts of different modified embodiments of FIG. 3.
Figure 4B:
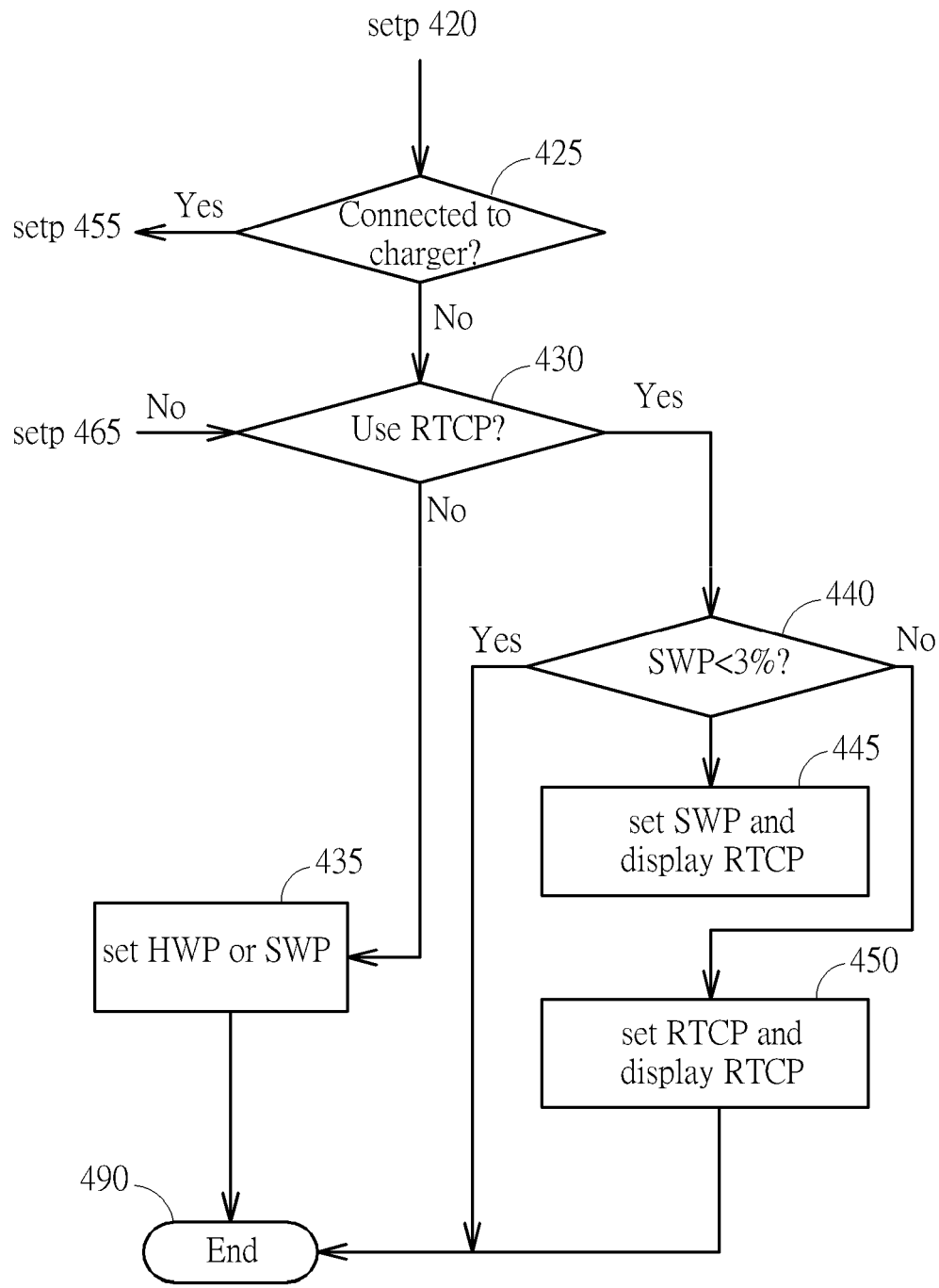

FIGS. 4A and 4B are flowchart diagrams showing a first embodiment of the method as shown in FIG. 3. Provided that substantially the same result is achieved, the steps of the flowchart shown in FIGS. 4A and 4B need not be in the exact order shown and need not be contiguous, that is, other steps can be intermediate. Steps of FIGS. 4A and 4B are detailed in the following:

Step 405: Start;

Step 410: Stop/disable a charger if the charger is connected to the battery;

Step 415: perform hardware gauge operation to obtain the hardware measurement percentage HWP, perform software gauge operation to obtain the software estimation percentage SWP, and read the previous power percentage RTCP from a memory device;

Step 420: Determine whether the battery is swapped or not. If the battery is not swapped, the flow proceeds to Step 425; otherwise, the flow proceeds to Step 455;

Step 425: determine whether the battery now is connected to a charger device or not. If the battery is not connected to the charger device, the flow proceeds to Step 430; otherwise, the flow proceeds to Step 455;

Step 430: determine whether to use the previous power percentage RTCP as the initial power percentage. If it is determined that the previous power percentage RTCP is not used to set the initial power percentage, the flow proceeds to Step 435; otherwise, the flow proceeds to Step 440;

Step 435: set the confidence level of hardware measurement percentage HWP or the confidence level of software estimation percentage SWP as a highest level, and configure the initial power percentage as the hardware measurement percentage HWP or the software estimation percentage SWP;

Step 440: determine whether the software estimation percentage SWP is lower than a low threshold. If the software estimation percentage SWP is lower than the low threshold such as 3 percent DOD, the flow proceeds to Step 445; otherwise, the flow proceeds to Step 450;

Step 445: set the confidence level of software estimation percentage SWP as a highest level and configure the initial power percentage as the software estimation percentage SWP, and display the previous power percentage RTCP for a user to indicate the user of the initial power percentage being equal to the previous power percentage RTCP without displaying the software estimation percentage SWP, so as to improve smoothness of user experience for battery power display;

Step 450: set the confidence level of previous power percentage RTCP as a highest level and configure the initial power percentage as the previous power percentage RTCP and display the previous power percentage RTCP for the user;

Step 455: calculate the absolute difference between hardware measurement percentage HWP and previous power percentage RTCP, and determine whether the absolute difference is higher than a specific threshold; if the absolute difference is higher than the specific threshold such as 30 percent DOD, the flow proceeds to Step 460; otherwise, the flow proceeds to Step 465;

Step 460: calculate a first absolute difference between the hardware measurement percentage HWP and software estimation percentage SWP and a second absolute difference between the software estimation percentage SWP and previous power percentage RTCP, and determine whether the first absolute difference is smaller than the second absolute difference; if so, the flow proceeds to Step 470, otherwise, the flow proceeds to Step 465;

Step 465: calculate the absolute difference between the software estimation percentage SWP and the previous power percentage RTCP, and determine whether the absolute difference is greater than a threshold such as 10 percent plus or minus one percent; if the absolute difference is greater than the threshold, the flow proceeds to Step 475; otherwise, the flow proceeds to Step 430;

Step 470: calculate the absolute difference between the hardware measurement percentage HWP and software estimation percentage SWP, and determine whether the absolute difference is higher than a threshold such as 15 percent; if the absolute difference is higher than 15 percent, the flow proceeds to Step 480; otherwise, the flow proceeds to Step 485;

Step 475: calculate a third absolute difference between the software estimation percentage SWP and previous power percentage RTCP and a fourth absolute difference between the software estimation percentage SWP and a rated battery power percentage VBATP, and determine whether the third absolute difference is higher than the fourth absolute difference. If higher, the flow proceeds to Step 480; otherwise, the flow proceeds to Step 430;

Step 480: set the confidence level of software estimation percentage SWP as a highest level, and configure the initial power percentage as the software estimation percentage SWP and display the software estimation percentage SWP for the user;

Step 485: set the confidence level of hardware measurement percentage HWP as a highest level, and configure the initial power percentage as the hardware measurement percentage HWP and display the hardware measurement percentage HWP for the user; and Step 490: End.

Figure 5:
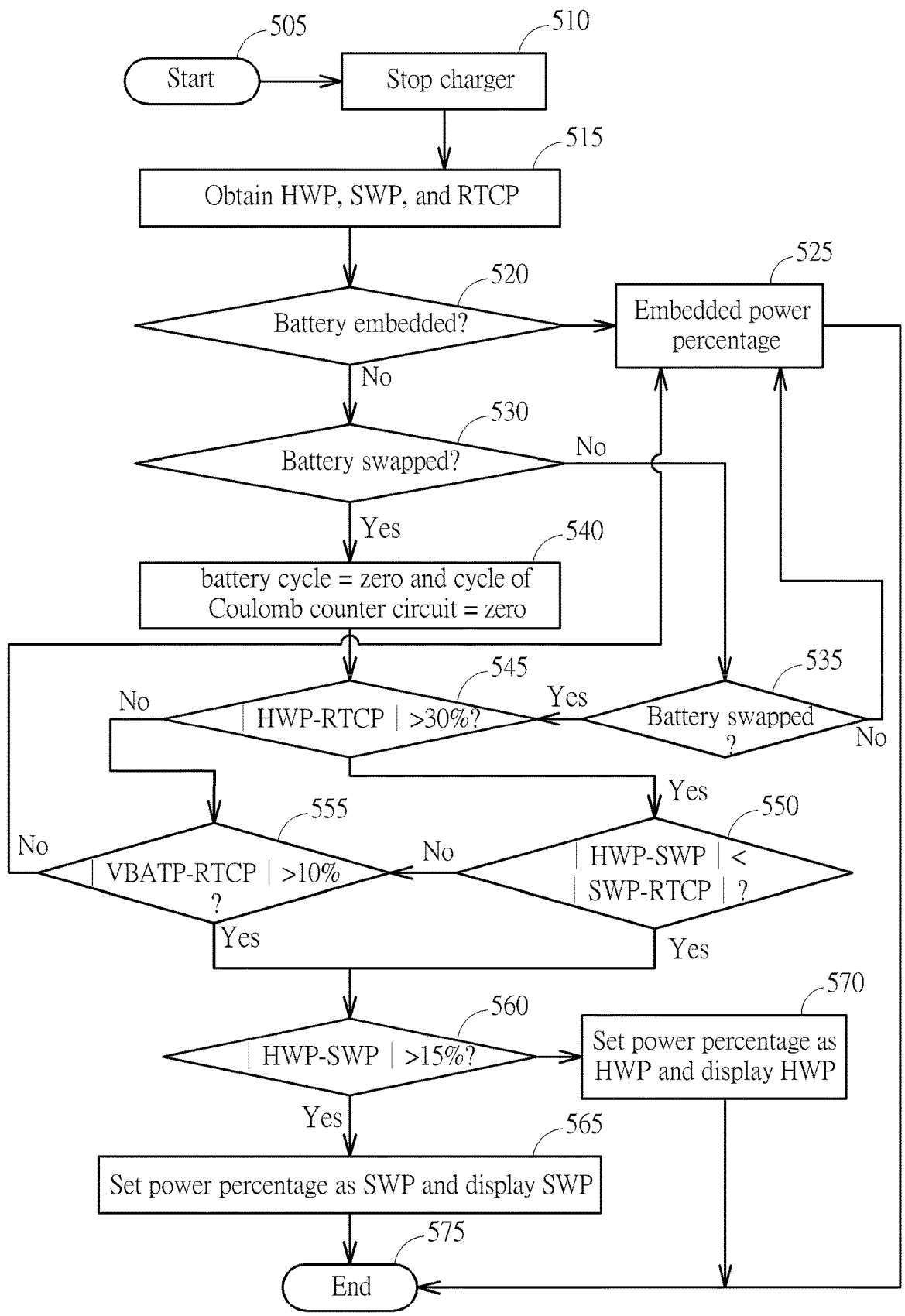

FIG. 5 is a flowchart diagram showing a second embodiment of the method as shown in FIG. 3. Provided that substantially the same result is achieved, the steps of the flowchart shown in FIG. 5 need not be in the exact order shown and need not be contiguous, that is, other steps can be intermediate. Steps of FIG. 5 are detailed in the following:

Step 505: start;

Step 510: Stop/disable a charger if the charger is connected to the battery;

Step 515: perform hardware gauge operation to obtain the hardware measurement percentage HWP, perform software gauge operation to obtain the software estimation percentage SWP, and read the previous power percentage RTCP from a memory device;

Step 520: determine whether the battery is embedded within the battery pack. If the battery is embedded, the flow proceeds to Step 525; otherwise, the flow proceeds to Step 530;

Step 525: configure the initial power percentage as an embedded power percentage;

Step 530: Determine whether the battery is swapped or not. If the battery is not swapped, the flow proceeds to Step 535; otherwise, the flow proceeds to Step 540;

Step 535: determine whether the battery now is connected to a charger device or not. If the battery is not connected to the charger device, the flow proceeds to Step 525; otherwise, the flow proceeds to Step 545;

Step 540: configure the battery cycle as zero and the cycle of Coulomb counter circuit as zero;

Step 545: calculate the absolute difference between hardware measurement percentage HWP and previous power percentage RTCP, and determine whether the absolute difference is higher than a specific threshold; if the absolute difference is higher than the specific threshold such as 30 percent, the flow proceeds to Step 550; otherwise, the flow proceeds to Step 555;

Step 550: calculate a first absolute difference between the hardware measurement percentage HWP and software estimation percentage SWP and a second absolute difference between the software estimation percentage SWP and previous power percentage RTCP, and determine whether the first absolute difference is smaller than the second absolute difference; if so, the flow proceeds to Step 560, otherwise, the flow proceeds to Step 555;

Step 555: calculate the absolute difference between a rated battery power percentage VBATP and the previous power percentage RTCP, and determine whether the absolute difference is greater than 10 percent. If the absolute difference is greater than 10 percent, the flow proceeds to Step 560; otherwise, the flow proceeds to Step 525;

Step 560: calculate the absolute difference between the hardware measurement percentage HWP and software estimation percentage SWP, and determine whether the absolute difference is greater than a threshold such as 15 percent; if the absolute difference is greater than 15 percent, the flow proceeds to Step 565; otherwise, the flow proceeds to Step 570;

Step 565: set the confidence level of software estimation percentage SWP as a highest level, and configure the initial power percentage as the software estimation percentage SWP and display the software estimation percentage SWP for the user;

Step 570: set the confidence level of hardware measurement percentage HWP as a highest level, and configure the initial power percentage as the hardware measurement percentage HWP and display the hardware measurement percentage HWP for the user; and Step 575: End.

Figure 6A:
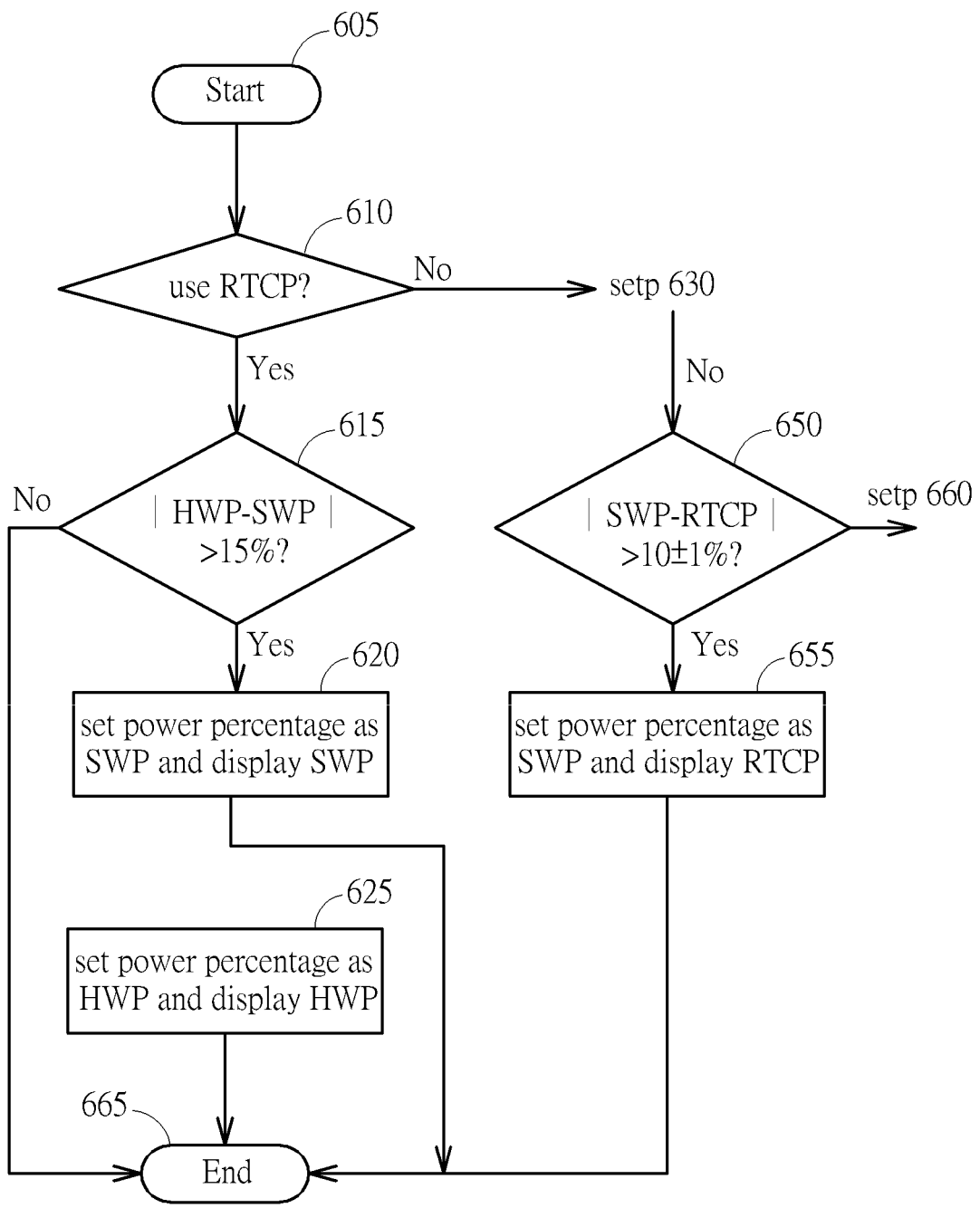
Figure 6B:
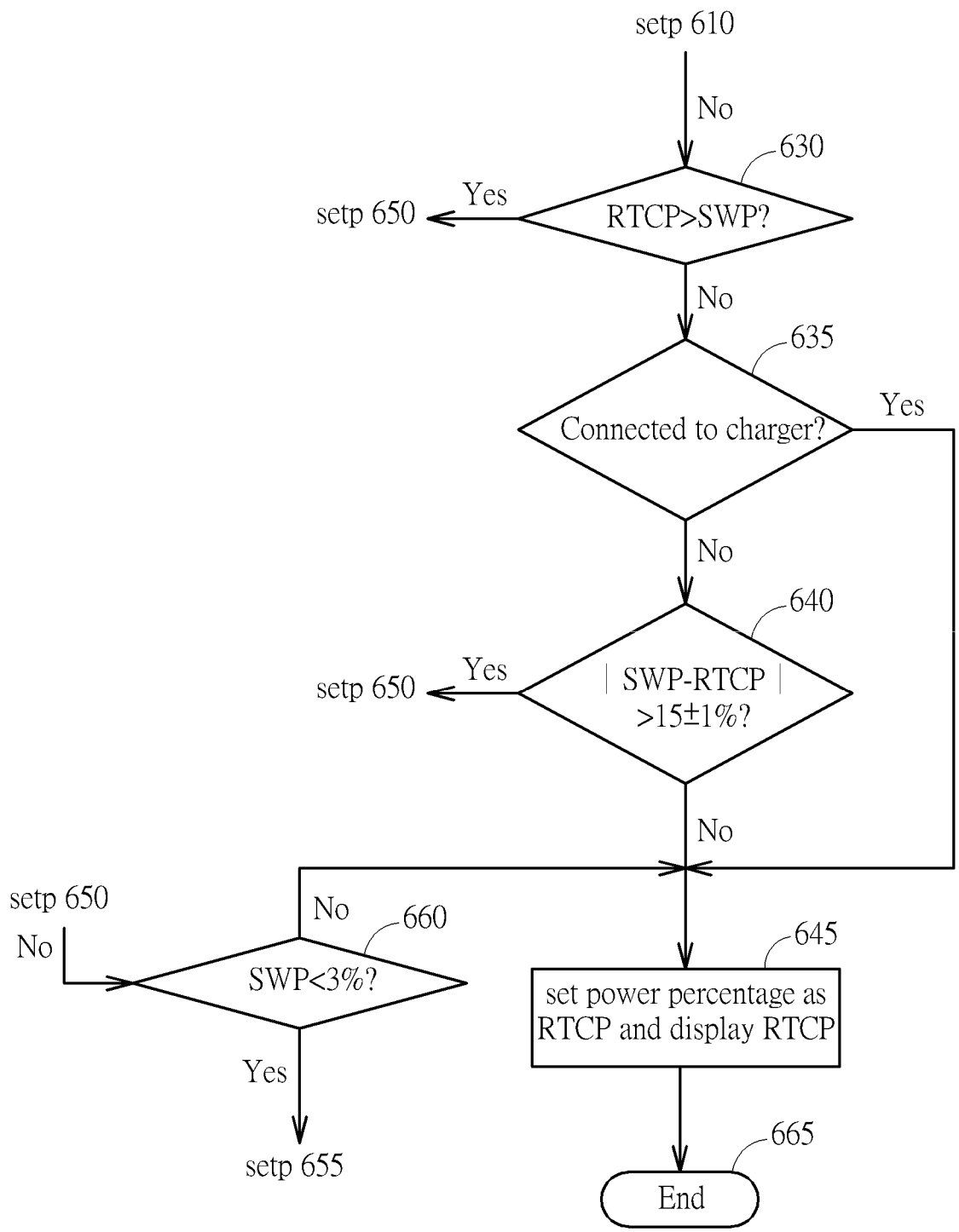

FIGS. 6A and 6B are flowchart diagrams showing a third embodiment of the method as shown in FIG. 3. Provided that substantially the same result is achieved, the steps of the flowchart shown in FIGS. 6A and 6B need not be in the exact order shown and need not be contiguous, that is, other steps can be intermediate. Steps of FIGS. 6A and 6B are detailed in the following:

Step 605: start;

Step 610: determine whether to use the previous power percentage RTCP as the initial power percentage. If it is determined that the previous power percentage RTCP is not used to set the initial power percentage, the flow proceeds to Step 615; otherwise, the flow proceeds to Step 630;

Step 615: calculate the absolute difference between the hardware measurement percentage HWP and software estimation percentage SWP, and determine whether the absolute difference is greater than a threshold such as 15 percent; if the absolute difference is greater than 15 percent, the flow proceeds to Step 620; otherwise, the flow proceeds to Step 625;

Step 620: set the confidence level of software estimation percentage SWP as a highest level, configure the initial power percentage as the software estimation percentage SWP, and display the software estimation percentage SWP for the user to indicate the battery's power when the system is restarted or rebooted;

Step 625: set the confidence level of hardware measurement percentage HWP as a highest level, configure the initial power percentage as the hardware measurement percentage HWP, and display the hardware measurement percentage HWP for the user to indicate the battery's power when the system is restarted or rebooted;

Step 630: determine whether the previous power percentage RTCP is higher than the software estimation percentage SWP. If the previous power percentage RTCP is higher than the software estimation percentage SWP, the flow proceeds to Step 650; otherwise, the flow proceeds to Step 635;

Step 635: determine whether the battery is now connected or plugged in a charger device. If the battery is connected to the charger device, the flow proceeds to Step 645; otherwise, the flow proceeds to Step 640;

Step 640: calculate the absolute difference between software estimation percentage SWP and previous power percentage RTCP, and determine whether the absolute difference is greater than a threshold such as 15% plus or minus one percent. If the absolute difference is greater than 16% (or 14% in some situations), the flow proceeds to Step 650; otherwise, the flow proceeds to Step 645;

Step 645: set the confidence level of previous power percentage RTCP as a highest level, configure the initial power percentage as the previous power percentage RTCP, and display the previous power percentage RTCP for the user to indicate the battery's power when the system is restarted or rebooted;

Step 650: determine whether the absolute difference between software estimation percentage SWP and previous power percentage RTCP is greater than a lower threshold such as 10% plus or minus one percent. If the absolute difference is greater than 11% (or 9% in some situations), the flow proceeds to Step 655; otherwise, the flow proceeds to Step 660;

Step 655: set the confidence level of software estimation percentage SWP as a highest level, configure the initial power percentage as the software estimation percentage SWP, and display the previous power percentage RTCP (or previous power percentage RTCP minus one percent) for the user to indicate the battery's power when the system is restarted or rebooted;

Step 660: determine whether the software estimation percentage SWP is lower than a low threshold such as 3 percent. If the software estimation percentage SWP is lower than 3 percent, the flow proceeds to Step 655; otherwise, the flow proceeds to Step 645; and Step 665: End.

Similarly, for steps of FIGS. 4-6, in other embodiments, the method can be arranged to calculate or determine the confidence levels of previous power percentage RTCP, hardware measurement percentage HWP, and software estimation percentage SWP according to a voltage difference of at least one pair between the battery cell voltages corresponding to the percentages RTCP, HWP, and SWP. The corresponding operations (calculation and comparison with threshold(s)) associated with the battery cell voltages are similar to those associated with the three percentages; further description is not detailed for brevity.

Additionally, in some embodiments, the method can be arranged to adjust the above-mentioned confidence levels of the three percentages based on battery usage/history information, time information, aging factor, and/or temperature information. For example, the method can raise the confidence level of hardware measurement percentage HWP to a highest level if the time information indicates that the battery has been rested for a specific time period such as thirty minutes. That is, in this situation, the hardware measurement percentage HWP can be directly selected to set the initial power percentage. Therefore, after adjusting the confidence levels of the three percentages based on battery usage/history information, time information, aging factor, and/or temperature information, the method can accordingly set the initial power percentage. In addition, for example, the method can adjust the confidence levels if detecting that a charge consumption of the battery connected to a charger device is smaller than a low power threshold such as 5 (but not limited). In addition, for example, the method can adjust the confidence levels if detecting that a voltage gap between a new battery cell voltage and a previous battery cell voltage is greater than a voltage threshold such as 20 (but not limited). All these examples are not intended to be limitations of the invention. The battery usage/history information comprises the state history of the battery.

Figure 7:
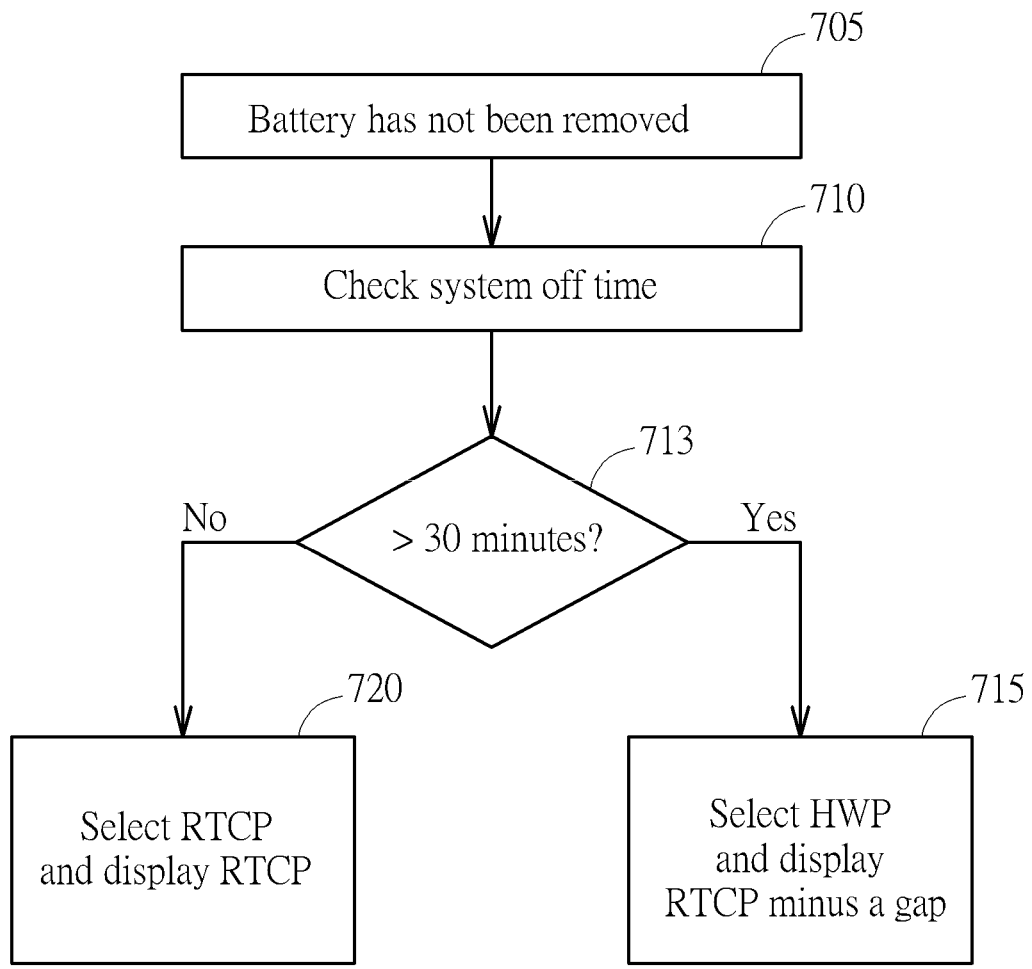
FIG. 7, FIG. 8, and FIG. 9 are flowcharts illustrating embodiments of different scenarios for determining or configuring the initial power percentage for the battery based on battery usage/history information, off time information, aging factor, and/or temperature information.

Based on battery usage/history information, off time information, aging factor, and/or temperature information, the method can more accurately determine or configure the initial power percentage for the battery. For example, in a first scenario, as shown in FIG. 7, the method determines/detects that the system is enabled or activated and no chargers are connected to the battery, i.e. no chargers plugging in the battery. In this scenario, the method is arranged to detect whether the battery has been removed or swapped. If detecting that the battery has not been removed (Step 705), the method is arranged to check/detect the system off time for the battery (Step 710), to determine whether the system off time is longer than a specific period such as 30 minutes or not (Step 713). The system off time means a time period from the last time the system is turned off (disabled) to the current timing the system is turned on (enabled). If the system off time is longer than 30 minutes, the flow proceeds to Step 715, and the method is arranged to use the hardware measurement percentage HWP as the initial power percentage of the battery by setting the confidence level of hardware measurement percentage HWP as a highest level. Also, the method can be arranged to display a previous power percentage RTCP minus a percentage gap for a user. Instead, if the system off time is shorter than 30 minutes, the flow proceeds to Step 720, and the method is arranged to use the previous power percentage RTCP as the initial power percentage of the battery by setting the confidence level of previous power percentage RTCP as a highest level. Also, the method is arranged to display the previous power percentage RTCP for the user.

Figure 8:
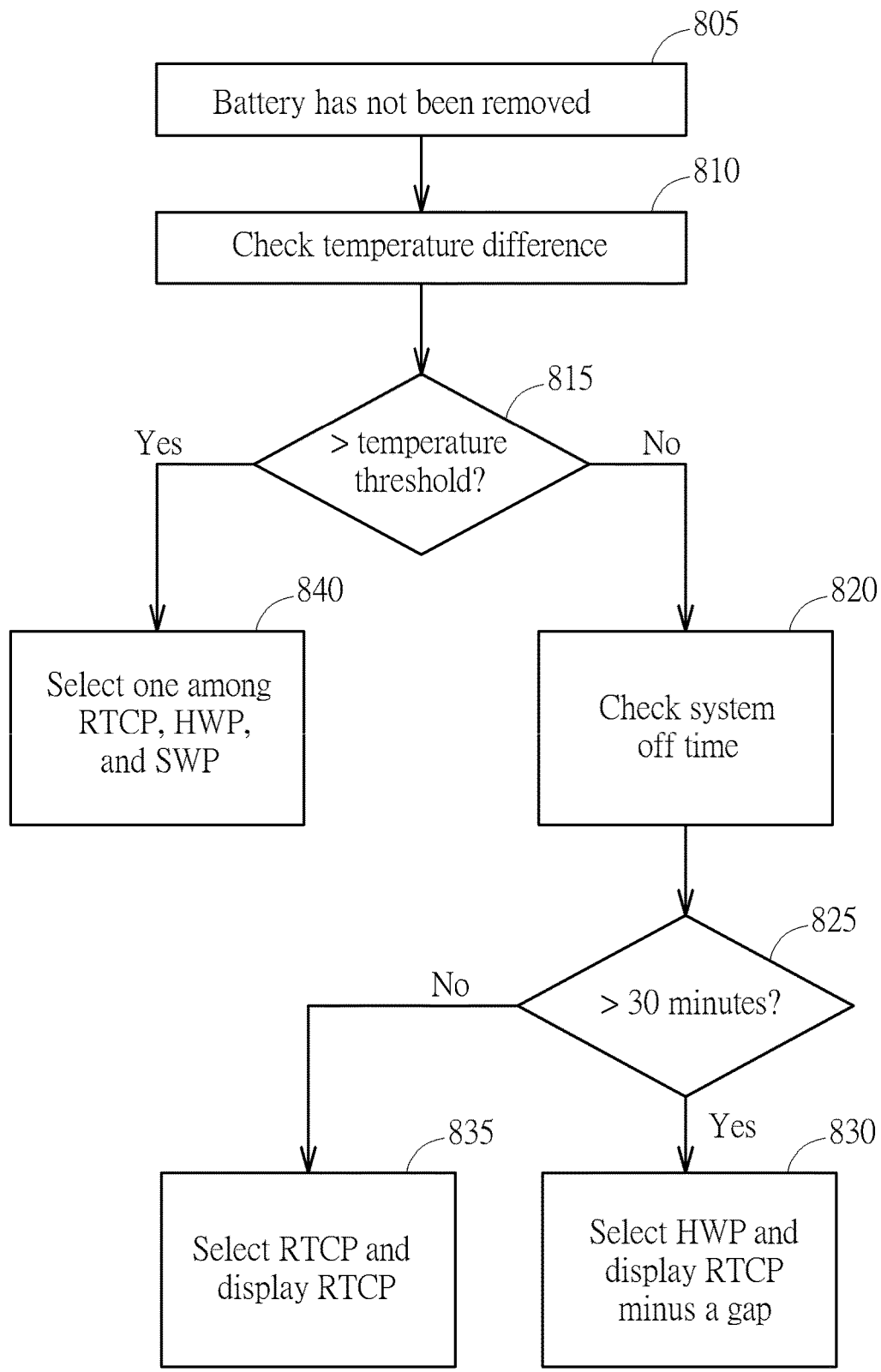

In a second scenario, as shown in FIG. 8, the method determines/detects that no chargers are connected to the battery and the system is enabled or activated at a different temperature condition compared to the temperature condition at which the system is being disabled. In this scenario, the method is arranged to detect whether the battery has been removed or swapped. If detecting that the battery has not been removed (Step 805), the method is arranged to detect/check the temperature difference between the battery temperature when the system is disabled last time and the current temperature when the system is enabled again (Step 810), to determine whether the temperature difference is higher than a temperature threshold or not (Step 815). If the temperature difference is not higher than the temperature threshold, the flow proceeds to Step 820, and the method is arranged to check/detect the system off time for the battery. The method is arranged to determine whether the system off time is longer than a specific period such as 30 minutes or not (Step 825). If the system off time is longer than a specific period such as 30 minutes, the flow proceeds to Step 830, and the method is arranged to use the hardware measurement percentage HWP as the initial power percentage of the battery by setting the confidence level of hardware measurement percentage HWP as a highest level. Also, the method can be arranged to display a previous power percentage RTCP minus a percentage gap for a user. If the system off time is shorter than the specific period such as 30 minutes, the flow proceeds to Step 835, and the method is arranged to use the previous power percentage RTCP as the initial power percentage of the battery by setting the confidence level of previous power percentage RTCP as a highest level. Also, the method is arranged to display the previous power percentage RTCP for the user. Instead, in the second scenario, if the temperature difference is higher than the temperature threshold, the flow proceeds to Step 840, and the method is arranged to select one among the previous power percentage RTCP, hardware measurement percentage HWP, and software measurement percentage SWP as the initial power percentage of the battery based on their confidence levels.

Figure 9:
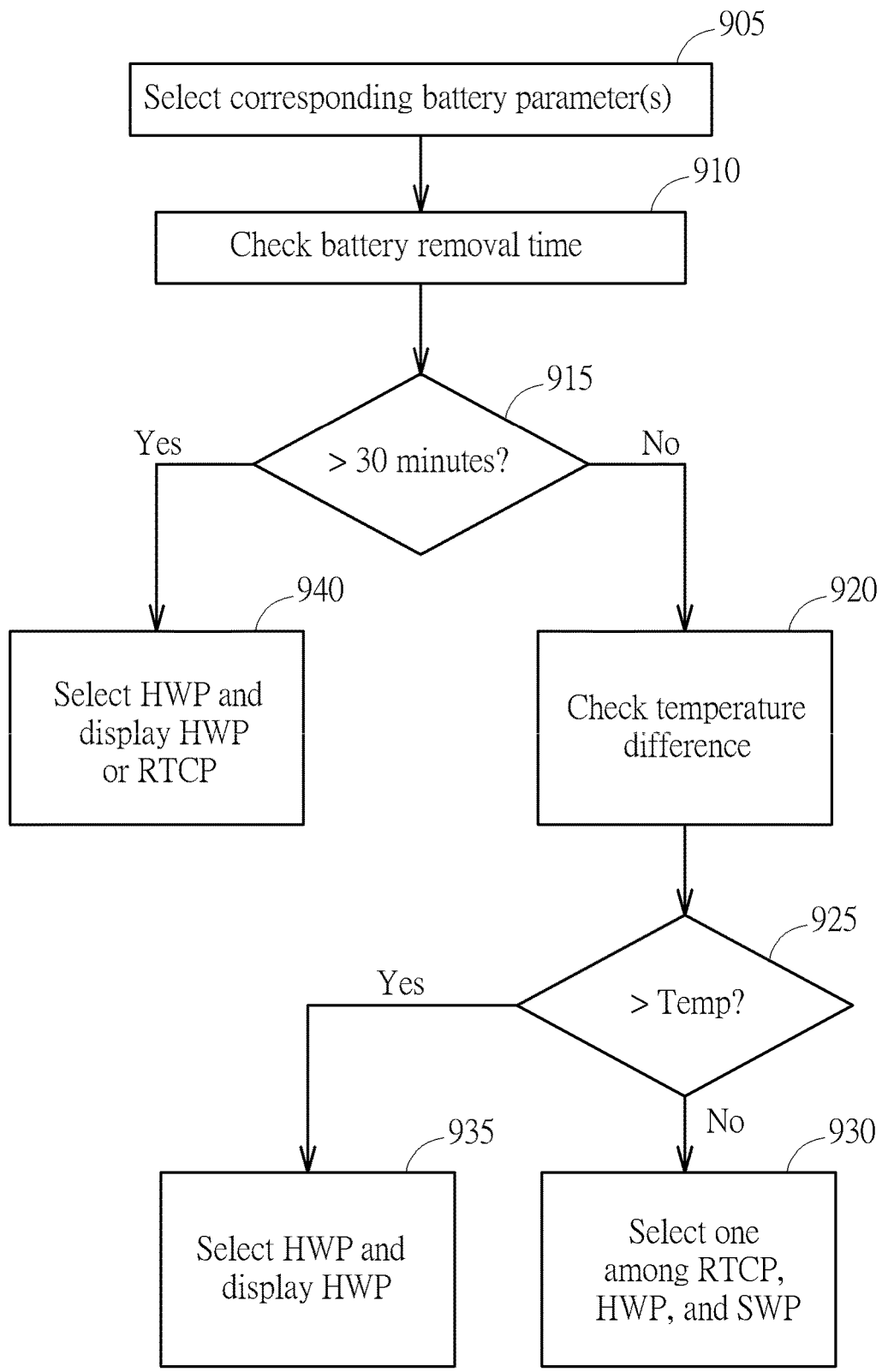

In a third scenario, as shown in FIG. 9, the method determines/detects that no chargers are connected to the battery and the battery was removed. In this scenario, the method is arranged to detect whether the battery has been removed or swapped. If detecting that the battery has been removed, the method is arranged to detect or check specific information of the battery such as a battery identification, battery chemical composition, or battery characteristics, to select corresponding battery parameter(s) (Step 905). After determining the battery parameter(s), the method is arranged to detect whether the battery has been removed or swapped. In this scenario, the method can detect that the battery was removed. The, the method is arranged to detect or check the battery removal time (Step 910). After detecting the battery removal time, the method is arranged to compare and determine whether the battery removal time is longer than a specific time period such as 30 minutes or not (Step 915). If the battery removal time is shorter than 30 minutes, the flow proceeds to Step 920, and the method is arranged to detect/check the temperature difference between the battery temperature when the system is disabled last time and the current temperature when the system is enabled again, to determine whether the temperature difference is higher than a temperature threshold Temp or not (Step 925). If the temperature difference is not higher than the temperature threshold Temp, the flow proceeds to Step 930, and the method is arranged to select one among the previous power percentage RTCP, hardware measurement percentage HWP, and software measurement percentage SWP as the initial power percentage of the battery based on their confidence levels. If the temperature difference is higher than the temperature threshold Temp, the flow proceeds to Step 935, and the method is arranged to use the hardware measurement percentage HWP as the initial power percentage of the battery by setting the confidence level of hardware measurement percentage HWP as a highest level. Also, the method can be arranged to display the hardware measurement percentage HWP for a user. Instead, if the battery removal time is longer than 30 minutes, the flow proceeds to Step 940, and the method is arranged to use the hardware measurement percentage HWP as the initial power percentage of the battery by setting the confidence level of hardware measurement percentage HWP as a highest level. Also, the method can be arranged to display the hardware measurement percentage HWP or the previous power percentage RTCP for a user.

In a fourth scenario, the method can determine/detect that a charger was plugged in/out from the last time the system is turned off (disabled) to the current timing the system is turned on (enabled), to determine the initial power percentage for the battery. The method can be arranged to determine whether a charger circuit is plugged in. When detecting that the charger circuit is plugged in, the method is arranged to use the charger circuit to perform hardware percentage estimation and use a measurement result of the charger circuit as the initial power percentage of the battery. Instead, if detecting that the charger circuit was plugged in and now is plugged out, the method is arranged to use the hardware measurement percentage HWP or the software measurement percentage SWP as the initial power percentage of the battery by setting the confidence level of hardware measurement percentage HWP or the confidence level of software measurement percentage SWP as a highest level. Also, the method can be arranged to display the hardware measurement percentage HWP or the software measurement percentage SWP for a user.

In a fifth scenario, the method can determine/detect that a charger was plugged in from the last time the system is turned off (disabled) to the current timing the system is turned on (enabled), to determine the initial power percentage for the battery. The method can be arranged to determine whether a charger circuit is plugged in. When detecting that the charger circuit is plugged in, the method is arranged to use the charger circuit to perform hardware percentage estimation and use a measurement result of the charger circuit as the initial power percentage of the battery. Instead, if detecting that the charger circuit was plugged in and now is plugged out, the method is arranged to use the hardware measurement percentage HWP or the software measurement percentage SWP as the initial power percentage of the battery by setting the confidence level of hardware measurement percentage HWP or the confidence level of software measurement percentage SWP as a highest level. Also, the method can be arranged to display the hardware measurement percentage HWP or the software measurement percentage SWP for a user.

It should be noted that the method can be arranged to determine the power percentage of the battery based on a combined scenario of the above-mentioned different scenarios. That is, the method is capable of more accurately determining the power percentage of the battery based on at least one information of charger plugged in/out, battery plugged in/out, temperature difference, system off time, and battery removal time. The above scenarios are not meant to be limitations of the invention.

The above-mentioned procedures of FIGS. 3-6 or at least one step can be performed through a controller or microcontroller by executing corresponding program code(s) loaded from a memory device such as a register circuit. For example, the controller 210 of FIG. 2 can be arranged to load program codes from the memory device 205 and execute the program codes to perform the at least one step to grade/adjust/set the confidence levels to dynamically select one of the three percentages as the initial power percentage of the battery. Further description is not detailed for brevity.

Additionally, in some situations, a battery is with a percent of SOC (state of charge) or DOD (depth of discharge) which may be mistaken as a higher percent of SOC/DOD or a lower percent of SOC/DOD. For example, 100% SOC may be mistaken as 30% SOC or 40% SOC may be mistaken as 100% SOC. In these situations, only using the voltage-based fuel gauge operation may be still able to calibrate or adjust a battery power percentage estimation result successfully only if this waits for a longer convergence time to complete the calibration; actually, such convergence time may be equal to thirty minutes or one hour. It is extremely inconvenient for a user to obtain an accurate battery power percentage only after waiting for such longer time.

To solve the above-mentioned problems, in the embodiments of the invention, the power management apparatus 200 can be arranged to execute fast/rapid compensation/calibration for a first fuel gauge operation based on information measured by a second fuel gauge operation different from the first fuel gauge operation. The first fuel gauge operation may be the voltage-based fuel gauge operation mentioned above, and the second fuel gauge operation may be the Coulomb-counter-based fuel gauge operation mentioned above. However, this is not intended to be a limitation.

In the embodiments, the power management apparatus 200 is arranged to employ and perform the Coulomb-counter-based fuel gauge operation to measure and obtain accurate information such as an accurate value of power/energy amount charged for or discharged from the battery 201 and/or an accurate value of battery current passing through the battery 201. For example, the value of power/energy amount charged for or discharged from the battery 201 can be measured periodically. The battery current passing through the battery 201 can be a battery current measured instantaneously or averagely. For example, the power management apparatus 200 adopts such accurate value of power/energy amount charged for or discharged from the battery 201 to reversely derive an accurate value of the battery current passing through the battery 201, and then adopts the derived value of battery current to calculate a correct/accurate value of a battery cell voltage of battery 201. The power management apparatus 200 finally can obtain or get an accurate/correct battery power percentage of battery 201 by referring to a mapping table (or a mapping curve) defining a relationship between battery cell voltage and battery power percentage based on the correct/accurate value of battery cell voltage. Similarly, the power management apparatus 200 can directly uses the accurate value of battery current measured by Coulomb-counter-based fuel gauge operation to calculate the correct/accurate value of the battery cell voltage of battery 201. In addition, after calculating the correct/accurate value of the battery cell voltage, the power management apparatus 200 may adopt such correct/accurate value to calibrate or adjust a battery power percentage measured by the Coulomb-counter-based fuel gauge operation.

Figure 10:
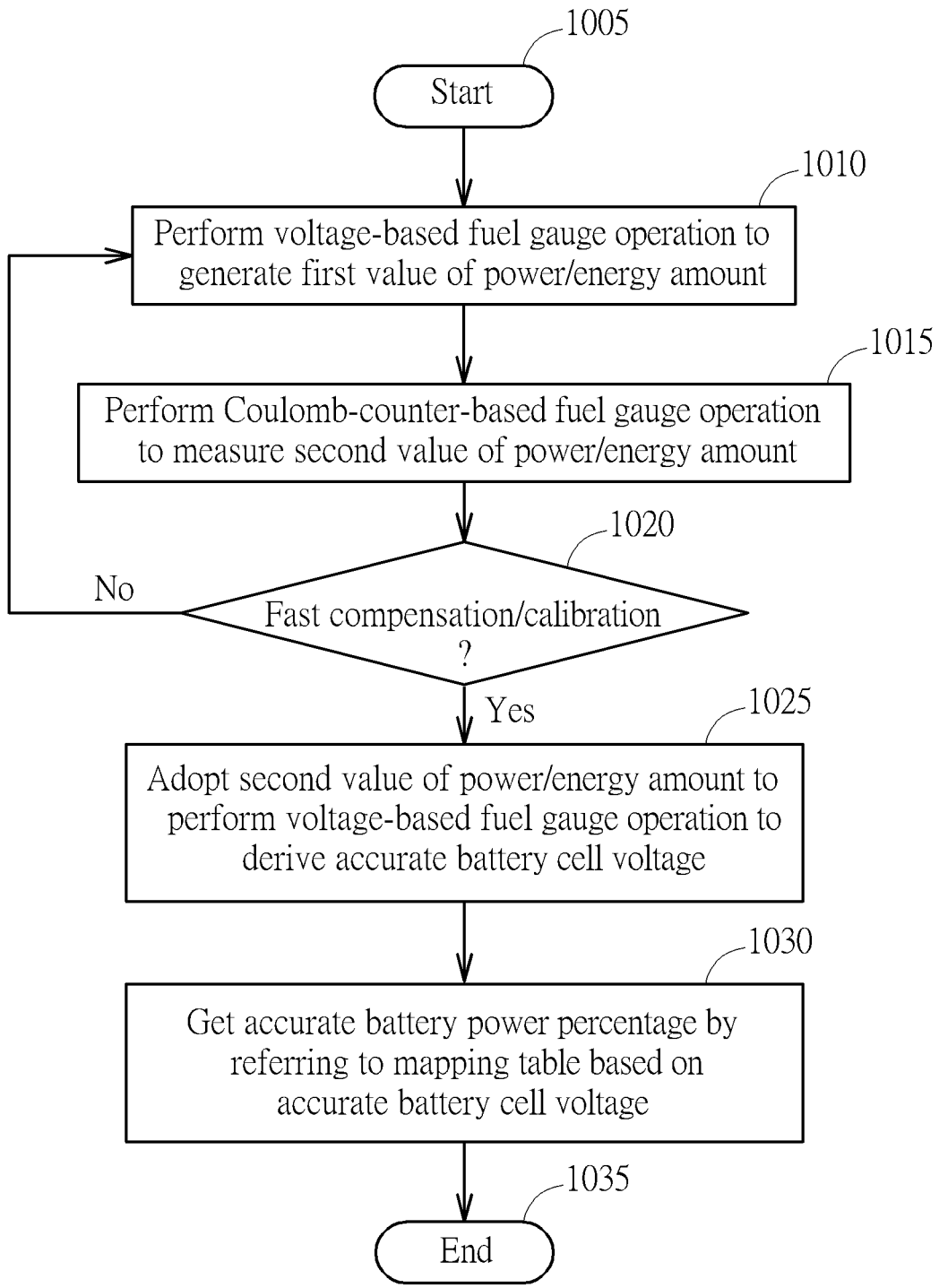
FIG. 10 is a diagram showing a flowchart of a first example of the operation of the controller of FIG. 2 for performing the voltage-based fuel gauge operation to obtain the correct battery power percentage by adopting information of Coulomb-counter-based fuel gauge operation.

FIG. 10 is a diagram showing a flowchart of a first example of the operation of controller 210 for performing the voltage-based fuel gauge operation to obtain the correct battery power percentage by adopting information of Coulomb-counter-based fuel gauge operation. Provided that substantially the same result is achieved, the steps of the flowchart shown in FIG. 10 need not be in the exact order shown and need not be contiguous, that is, other steps can be intermediate. Steps of FIG. 10 are detailed in the following:

Step 1005: Start;

Step 1010: Controller 210 performs the voltage-based fuel gauge operation to generate or estimate a first value of power/energy amount charged for or discharged from the battery 201;

Step 1015: Controller 210 performs the Coulomb-counter-based fuel gauge operation to generate or measure a second value of power/energy amount charged for or discharged from the battery 201;

Step 1020: Controller 210 determines whether to execute fast compensation/calibration for voltage-based fuel gauge operation; if so, the flow proceeds to Step 1025, otherwise, the flow proceeds to Step 1010;

Step 1025: Controller 210 adopts the second value of power/energy amount, measured by Coulomb-counter-based fuel gauge operation, to perform voltage-based fuel gauge operation so as to derive and calculate an accurate value of the battery cell voltage of battery 201;

Step 1030: Controller 210 gets an accurate battery power percentage of battery 201 by referring to the mapping table defining the relationship between battery cell voltage and battery power percentage based on the accurate value of battery cell voltage; and Step 1035: End.

In Step 1020, for example, the controller 210 is arranged to calculate a difference ratio between the first and second values and to determine whether the difference ratio is higher than a specific threshold so as to decide whether to execute fast compensation/calibration for voltage-based fuel gauge operation. However, this is not intended to be a limitation. The controller 210 may be arranged to trigger execution of fast compensation/calibration based on other algorithms. The specific threshold for example is equal to 1% or 0.5%. If the difference ratio is higher than 1% or 0.5%, the flow proceeds to Step 1025; otherwise, the flow proceeds to Step 1010, and the controller 210 repeats Step 1010 and Step 1015.

In Step 1025, the controller 210 adopts the second value of power/energy amount, measured by Coulomb-counter-based fuel gauge operation, to derive and calculate the accurate value of the battery cell voltage of battery 201. For instance, the controller 210 calculates the value of the battery cell voltage based on the following equations:

$$\Delta CAR = I1 \times \Delta T$$

$$I1 = Vzcv - Vbat/R$$

wherein $\Delta CAR$ indicates the value of power/energy amount measured by the Coulomb-counter-based fuel gauge operation during the time interval $\Delta T$, I1 indicates the battery current passing through battery 201 whether the battery 201 is charged or discharged, Vbat indicates an external battery voltage which can be measured by using voltage-based fuel gauge operation, R indicates an resistance of the sensing resistor used by voltage-based fuel gauge operation, and Vzcv indicates the value of battery cell voltage of battery 201 to be calculated/derived. The sensing resistor for example is included within the battery 201; that is, the resistance of sensing resistor is the equivalent resistance of battery 201. Since the voltage-based fuel gauge operation can be arranged to calculate the first value of power/energy amount, the invention equivalently is to adopt the second value of power/energy amount to replace the first value of power/energy amount.

After obtaining the accurate value Vzcv of battery cell voltage of battery 201, in Step 1030, the controller 210 can directly obtain or get an accurate battery power percentage of battery 201 by referring to the mapping table defining the relationship between battery cell voltage and battery power percentage based on the accurate value of battery cell voltage. The mapping table defining the relationship between battery cell voltage and battery power percentage is built in the voltage-based fuel gauge operation.

In another embodiment, the controller 210 may decide to execute fast compensation/calibration for voltage-based fuel gauge operation in response to the temperature change, change of battery aging factor(s), and/or the change of initial condition of a battery. For example, when a system is re-connected to a battery and/or a battery is initially used, the controller 210 can execute fast compensation/calibration for voltage-based fuel gauge operation when performing such voltage-based fuel gauge operation.

Figure 11:
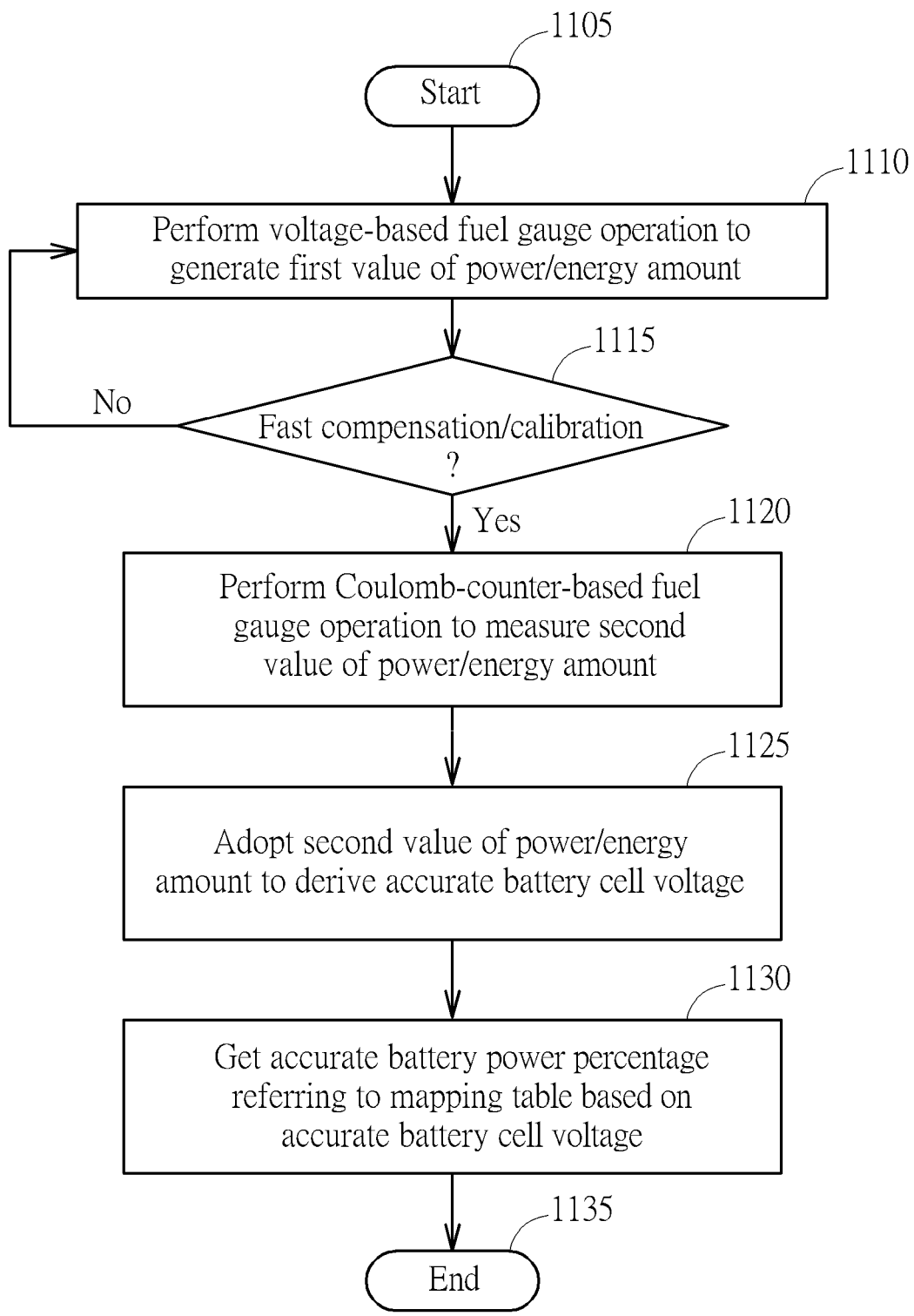
FIG. 11 is a diagram showing a flowchart of a second example of the operation of controller of FIG. 2 for performing the voltage-based fuel gauge operation to obtain the correct battery power percentage by adopting information of Coulomb-counter-based fuel gauge operation.

FIG. 11 is a diagram showing a flowchart of a second example of the operation of controller 210 for performing the voltage-based fuel gauge operation to obtain the correct battery power percentage by adopting information of Coulomb-counter-based fuel gauge operation. Provided that substantially the same result is achieved, the steps of the flowchart shown in FIG. 11 need not be in the exact order shown and need not be contiguous, that is, other steps can be intermediate. Steps of FIG. 11 are detailed in the following:

Step 1105: Start;

Step 1110: Controller 210 performs the voltage-based fuel gauge operation to generate or estimate a first value of power/energy amount charged for or discharged from the battery 201;

Step 1115: Controller 210 determines whether to execute fast compensation/calibration of voltage-based fuel gauge operation in response to temperature change, change of battery aging factor(s), and/or the change of initial condition of a battery; if so, the flow proceeds to Step 1120, otherwise, the flow proceeds to Step 1110;

Step 1120: Controller 210 performs the Coulomb-counter-based fuel gauge operation to generate or estimate a second value of power/energy amount charged for or discharged from the battery 201;

Step 1125: Controller 210 adopts the second value of power/energy amount, measured by Coulomb-counter-based fuel gauge operation, to derive and calculate an accurate value of the battery cell voltage of battery 201;

Step 1130: Controller 210 gets an accurate battery power percentage of battery 201 by referring to the mapping table defining the relationship between battery cell voltage and battery power percentage based on the accurate value of battery cell voltage; and Step 1135: End.

In addition, in Step 1115, the controller 210 can also be arranged to periodically execute fast compensation/calibration of voltage-based fuel gauge operation.

Additionally, in other embodiments, the controller 210 may be arranged to refer to the battery current measured by Coulomb-counter-based fuel gauge operation to perform fast compensation/calibration for voltage-based fuel gauge operation when performing such voltage-based fuel gauge operation.

Figure 12:
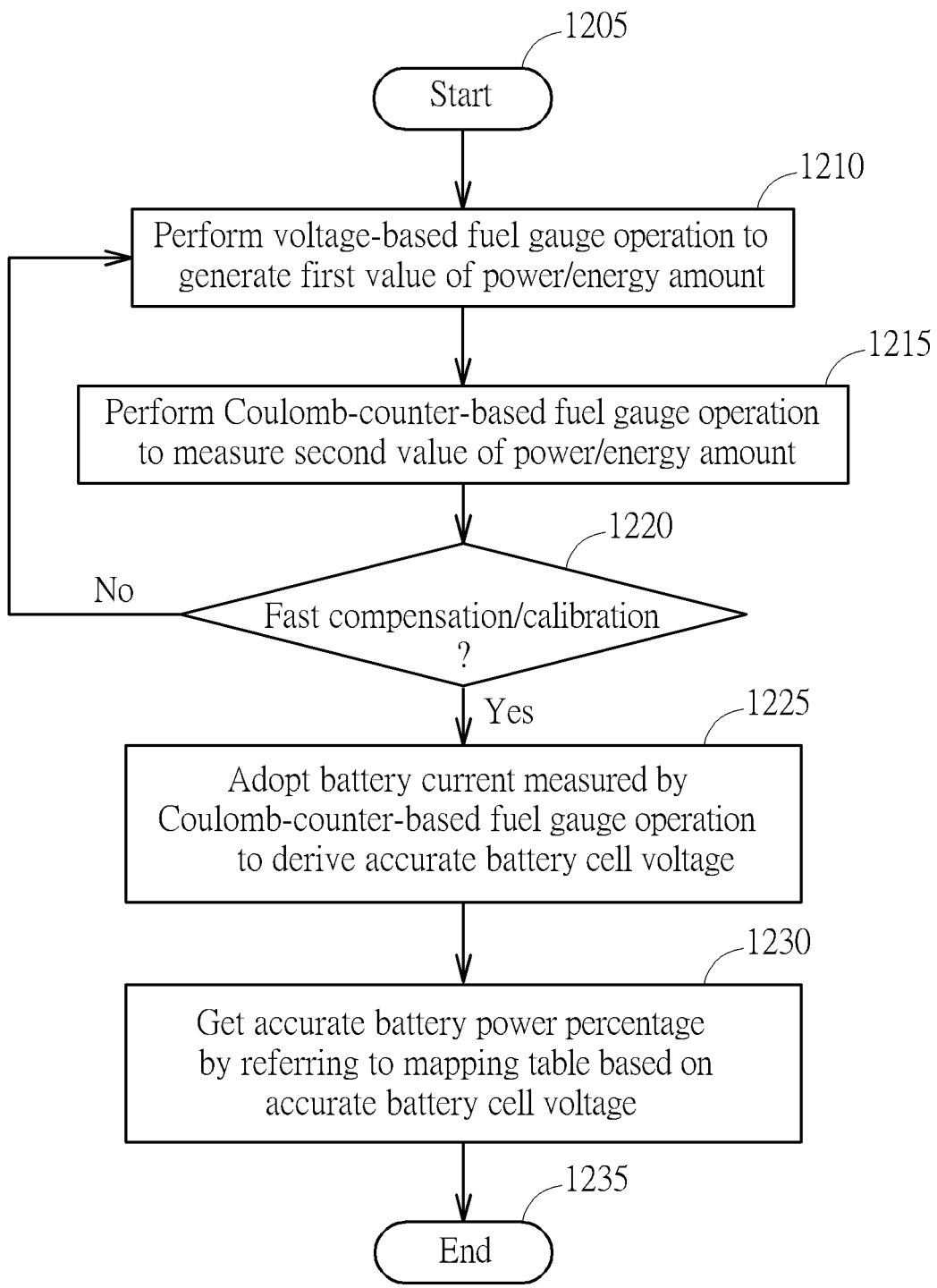
FIG. 12 is a diagram showing a flowchart of a third example of the operation of the controller of FIG. 2 for performing the voltage-based fuel gauge operation to obtain the correct battery power percentage by adopting information of Coulomb-counter-based fuel gauge operation.

FIG. 12 is a diagram showing a flowchart of a third example of the operation of controller 210 for performing the voltage-based fuel gauge operation to obtain the correct battery power percentage by adopting information of Coulomb-counter-based fuel gauge operation. Provided that substantially the same result is achieved, the steps of the flowchart shown in FIG. 12 need not be in the exact order shown and need not be contiguous, that is, other steps can be intermediate. Steps of FIG. 12 are detailed in the following:

Step 1205: Start;

Step 1210: Controller 210 performs the voltage-based fuel gauge operation to generate or estimate a first value of power/energy amount charged for or discharged from the battery 201;

Step 1215: Controller 210 performs the Coulomb-counter-based fuel gauge operation to generate or estimate a second value of power/energy amount charged for or discharged from the battery 201;

Step 1220: Controller 210 determines whether to execute fast compensation/calibration for voltage-based fuel gauge operation; if so, the flow proceeds to Step 1225, otherwise, the flow proceeds to Step 1210;

Step 1225: Controller 210 adopts the battery current I1, measured by Coulomb-counter-based fuel gauge operation, to derive and calculate an accurate value of the battery cell voltage of battery 201;

Step 1230: Controller 210 gets an accurate battery power percentage of battery 201 by referring to the mapping table defining the relationship between battery cell voltage and battery power percentage based on the accurate value of battery cell voltage; and Step 1235: End.

In Step 1225, the controller 210 adopts the battery current I1, measured by Coulomb-counter-based fuel gauge operation, to derive and calculate the accurate value of the battery cell voltage of battery 201. For instance, the controller 210 calculates the value of the battery cell voltage based on the following equations:

$$I1 = Vzcv - Vbat/R$$

To summarize the embodiments of FIGS. 10-12, when performing the first fuel gauge operation to estimate the battery power percentage, the controller 210 can be arranged to execute fast/rapid compensation/calibration for the first fuel gauge operation such as voltage-based fuel gauge operation by referring to information (battery current and/or power/energy amount) measured by the second fuel gauge operation such as Coulomb-counter-based fuel gauge operation to directly and rapidly calculate an accurate battery cell voltage of the battery 201, so as to use the accurate battery cell voltage to obtain/generate a correct battery power percentage rapidly based on the mapping table mentioned above. The power management apparatus 200 is able to obtain the correct battery power percentage rapidly by executing the fast compensation/calibration and referring to the mapping table at a time. Accordingly, the power management apparatus 200 merely needs to wait for less time to obtain the correct battery power percentage.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for estimating a battery power percentage of a battery, comprising:
    performing a first fuel gauge operation upon the battery; and
    using the first fuel gauge operation to generate the battery power percentage of the battery by referring to information measured by a second fuel gauge operation performed upon the battery, the second fuel gauge operation being different from the first fuel gauge operation;
    wherein the first fuel gauge operation is performed based on the information measured by the second fuel gauge operation performed upon the battery so as to generate the battery power percentage of the battery; and, the information, measured by the second fuel gauge operation, comprises a power/energy amount charged for or discharged from the battery or a battery current passing through the battery.

2. The method of claim 1, wherein the first fuel gauge operation is a voltage-based fuel gauge operation, and the second fuel gauge operation is a Coulomb-counter-based fuel gauge operation.

3. The method of claim 1, wherein the using step comprises:
    using the second fuel gauge operation to measure a power/energy amount charged for or discharged from the battery during a time interval;
    calculating a battery cell voltage of the battery by referring to the measured power/energy amount; and
    generating the battery power percentage of the battery by referring to a mapping table of the first fuel gauge operation according to the calculated battery cell voltage of the battery, the mapping table defining a relationship between the calculated battery cell voltage of the battery and the battery power percentage of the battery.

4. The method of claim 3, wherein the calculating step comprises:
    deriving a battery current passing through the battery according to the measured power/energy amount and the time interval; and
    calculating the battery cell voltage of the battery according to the derived battery current, a resistance of the battery, and an external battery voltage measured by the first fuel gauge operation.

5. The method of claim 1, wherein the using step comprises:
    using the second fuel gauge operation to measure a battery current passing through the battery;
    calculating a battery cell voltage of the battery by referring to the measured battery current; and
    generating the battery power percentage of the battery by referring to a mapping table of the first fuel gauge operation according to the calculated battery cell voltage of the battery, the mapping table defining a relationship between the calculated battery cell voltage of the battery and the battery power percentage of the battery.

6. The method of claim 5, wherein the calculating step comprises:
    calculating the battery cell voltage of the battery according to the measured battery current, a resistance of the battery, and an external battery voltage measured by the first fuel gauge operation.

7. The method of claim 1, further comprising:
    performing the first fuel gauge operation to estimate a first value of power/energy amount charged for or discharged from the battery;
    performing the second first fuel gauge operation to measure a second value of power/energy amount charged for or discharged from the battery; and
    comparing the first value with the second value determine whether to trigger the using step.

8. The method of claim 7, wherein the comparing step comprises:
    calculating a difference ratio between the first value and the second value; and
    determining to perform the using step when the difference ratio is higher than a specific threshold.

9. The method of claim 1, further comprising:
    using the battery power percentage generated by the first fuel gauge operation to calibrate or adjust another battery power percentage measured by the second fuel gauge operation.

10. A power management apparatus for estimating a battery power percentage of a battery, comprising:
    a memory device;
    a controller, coupled to the memory device, configured for loading program code(s) from the memory device to:

perform a first fuel gauge operation upon the battery; and use the first fuel gauge operation to generate the battery power percentage of the battery by referring to information measured by a second fuel gauge operation performed upon the battery, the second fuel gauge operation being different from the first fuel gauge operation;

wherein the first fuel gauge operation is performed based on the information measured by the second fuel gauge operation performed upon the battery so as to generate the battery power percentage of the battery; and, the information, measured by the second fuel gauge operation, comprises a power/energy amount charged for or discharged from the battery or a battery current passing through the battery.

11. The power management apparatus of claim 10, wherein the first fuel gauge operation is a voltage-based fuel gauge operation, and the second fuel gauge operation is a Coulomb-counter-based fuel gauge operation.

12. The power management apparatus of claim 10, wherein the controller is arranged for:

using the second fuel gauge operation to measure a power/energy amount charged for or discharged from the battery during a time interval;

calculating a battery cell voltage of the battery by referring to the measured power/energy amount; and generating the battery power percentage of the battery by referring to a mapping table of the first fuel gauge operation according to the calculated battery cell voltage of the battery, the mapping table defining a relationship between the calculated battery cell voltage of the battery and the battery power percentage of the battery.

13. The power management apparatus of claim 12, wherein the controller is arranged for:

deriving a battery current passing through the battery according to the measured power/energy amount and the time interval; and calculating the battery cell voltage of the battery according to the derived battery current, a resistance of the battery, and an external battery voltage measured by the first fuel gauge operation.

14. The power management apparatus of claim 10, wherein the controller is arranged for:

using the second fuel gauge operation to measure a battery current passing through the battery;

calculating a battery cell voltage of the battery by referring to the measured battery current; and generating the battery power percentage of the battery by referring to a mapping table of the first fuel gauge operation according to the calculated battery cell voltage of the battery, the mapping table defining a relationship between the calculated battery cell voltage of the battery and the battery power percentage of the battery.

15. The power management apparatus of claim 14, wherein the controller is arranged for calculating the battery cell voltage of the battery according to the measured battery current, a resistance of the battery, and an external battery voltage measured by the first fuel gauge operation.

16. The power management apparatus of claim 10, wherein the controller is arranged for:

performing the first fuel gauge operation to estimate a first value of power/energy amount charged for or discharged from the battery;

performing the second first fuel gauge operation to measure a second value of power/energy amount charged for or discharged from the battery; and comparing the first value with the second value determine whether to trigger using the first fuel gauge operation to generate the battery power percentage of the battery by referring to the information measured by the second fuel gauge operation performed upon the battery.

17. The power management apparatus of claim 16, wherein the controller is arranged for:

calculating a difference ratio between the first value and the second value; and determining to perform the first fuel gauge operation to generate the battery power percentage of the battery by referring to the information measured by the second fuel gauge operation performed upon the battery when the difference ratio is higher than a specific threshold.

18. The power management apparatus of claim 10, wherein the controller is arranged for using the battery power percentage generated by the first fuel gauge operation to calibrate or adjust another battery power percentage measured by the second fuel gauge operation.

* * * * *